(12) United States Patent
Clidaras et al.

(10) Patent No.: US 8,743,543 B2
(45) Date of Patent: ***Jun. 3, 2014

(54) MODULAR COMPUTING ENVIRONMENTS

(75) Inventors: Jimmy Clidaras, Los Altos, CA (US);
William Whitted, Woodside, CA (US);
William Hamburgen, Palo Alto, CA
(US); Montgomery Sykora, Denver, CO
(US); Winnie Leung, Palo Alto, CA
(US); Gerald Aigner, Huobstrasse (CH);
Donald L. Beaty, Red Bank, NJ (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/544,839

(22) Filed: Jul. 9, 2012

(65) Prior Publication Data

US 2013/0083476 A1 Apr. 4, 2013

Related U.S. Application Data

(63) Continuation of application No. 12/815,892, filed on Jun. 15, 2010, now Pat. No. 8,218,322, which is a continuation of application No. 11/757,101, filed on Jun. 1, 2007, now Pat. No. 7,738,251.

(60) Provisional application No. 60/810,451, filed on Jun. 1, 2006.

(51) Int. Cl.
*H05K 7/20* (2006.01)
*F25D 23/12* (2006.01)
*F28F 7/00* (2006.01)
*B60F 1/00* (2006.01)
*G06F 15/16* (2006.01)
*G06F 13/00* (2006.01)

(52) U.S. Cl.
USPC ......... 361/701; 62/259.2; 165/80.4; 454/118; 709/249

(58) Field of Classification Search
USPC ........................................... 710/300
See application file for complete search history.

(56) References Cited

U.S. PATENT DOCUMENTS 4,407,185 A 10/1983 Haines et al.
4,589,712 A 5/1986 Hastings (Continued)

FOREIGN PATENT DOCUMENTS

CN 2687732 Y 3/2005
CN 1732727 A 2/2006

(Continued)

OTHER PUBLICATIONS

Office Action mailed Dec. 9, 2010 for Chinese application No. 200680055450.4 (12 pages).

(Continued)

*Primary Examiner* — Ryan Stiglic
(74) *Attorney, Agent, or Firm* — Fish & Richardson P.C.

(57) ABSTRACT

A computer system may include a connecting hub having a plurality of docking regions and be configured to provide to each docking region electrical power, a data network interface, a cooling fluid supply and a cooling fluid return; and a plurality of shipping containers that each enclose a modular computing environment that incrementally adds computing power to the system. Each shipping container may include a) a plurality of processing units coupled to the data network interface, each of which include a microprocessor; b) a heat exchanger configured to remove heat generated by the plurality of processing units by circulating cooling fluid from the supply through the heat exchanger and discharging it into the return; and c) docking members configured to releaseably couple to the connecting hub at one of the docking regions to receive electrical power, connect to the data network interface, and receive and discharge cooling fluid.

20 Claims, 13 Drawing Sheets

(56) References Cited

U.S. PATENT DOCUMENTS

| | | | |
|---|---|---|---|
| 5,119,014 A | 6/1992 | Kronberg | |
| 5,317,859 A | 6/1994 | Schneider et al. | |
| 5,458,991 A | 10/1995 | Severinsky | |
| 5,565,274 A | 10/1996 | Perrone et al. | |
| 5,579,522 A | 11/1996 | Christeson et al. | |
| 5,595,068 A | 1/1997 | Amr | |
| 5,596,844 A | 1/1997 | Kalinowski | |
| 5,694,307 A | 12/1997 | Murugan | |
| 5,722,886 A | 3/1998 | Steckly | |
| 5,746,950 A | 5/1998 | Villanueva | |
| 5,844,884 A | 12/1998 | Szlenski | |
| 6,009,177 A | 12/1999 | Sudia | |
| 6,034,873 A | 3/2000 | Ståhl et al. | |
| 6,138,413 A | 10/2000 | Fehr | |
| 6,138,935 A | 10/2000 | Fehr | |
| 6,249,221 B1 | 6/2001 | Reed | |
| 6,289,684 B1 | 9/2001 | Guidry et al. | |
| 6,290,024 B1 | 9/2001 | Ehlert | |
| 6,374,627 B1 | 4/2002 | Schumacher et al. | |
| 6,429,706 B1 | 8/2002 | Amin et al. | |
| 6,496,366 B1 | 12/2002 | Coglitore et al. | |
| 6,504,717 B1 | 1/2003 | Heard | |
| 6,506,111 B2 | 1/2003 | Sharp et al. | |
| D473,225 S | 4/2003 | Coglitore et al. | |
| 6,563,706 B1 | 5/2003 | Strickler | |
| D475,705 S | 6/2003 | Coglitore et al. | |
| 6,584,559 B1 | 6/2003 | Huh | |
| 6,587,343 B2 | 7/2003 | Novotny et al. | |
| 6,652,373 B2 | 11/2003 | Sharp et al. | |
| 6,652,374 B2 | 11/2003 | Sharp et al. | |
| 6,667,891 B2 | 12/2003 | Coglitore et al. | |
| 6,668,565 B1 | 12/2003 | Johnson et al. | |
| 6,672,955 B2 | 1/2004 | Charron | |
| 6,741,467 B2 | 5/2004 | Coglitore et al. | |
| 6,747,872 B1 | 6/2004 | Patel et al. | |
| 6,768,222 B1 | 7/2004 | Ricks | |
| 6,822,859 B2 | 11/2004 | Coglitore et al. | |
| 6,824,362 B2 | 11/2004 | Dodson | |
| 6,850,408 B1 | 2/2005 | Coglitore et al. | |
| 6,859,366 B2 | 2/2005 | Fink | |
| 6,867,967 B2 | 3/2005 | Mok | |
| 6,880,349 B2 | 4/2005 | Johnson et al. | |
| 6,896,612 B1 | 5/2005 | Novotny | |
| 6,904,968 B2 | 6/2005 | Beitelmal et al. | |
| 6,927,980 B2 | 8/2005 | Fukuda et al. | |
| 6,935,130 B2 | 8/2005 | Cheng et al. | |
| 6,937,947 B2 | 8/2005 | Trembley | |
| 6,967,283 B2 | 11/2005 | Rasmussen et al. | |
| 6,969,922 B2 | 11/2005 | Welches et al. | |
| 6,980,433 B2 | 12/2005 | Fink | |
| 7,011,576 B2 | 3/2006 | Sharp et al. | |
| 7,046,514 B2 | 5/2006 | Fink et al. | |
| 7,106,411 B2 | 9/2006 | Read et al. | |
| 7,123,477 B2 | 10/2006 | Coglitore et al. | |
| 7,145,772 B2 | 12/2006 | Fink | |
| 7,168,935 B1 | 1/2007 | Taminger et al. | |
| 7,173,820 B2 | 2/2007 | Fink et al. | |
| 7,173,821 B2 | 2/2007 | Coglitore et al. | |
| 7,214,843 B2 | 5/2007 | Beech et al. | |
| 7,278,273 B1 | 10/2007 | Whitted et al. | |
| 7,295,442 B2 * | 11/2007 | Garnett et al. | 361/728 |
| 7,382,613 B2 | 6/2008 | Vinson et al. | |
| 7,500,911 B2 | 3/2009 | Johnson et al. | |
| 7,511,959 B2 | 3/2009 | Belady et al. | |
| 7,511,960 B2 | 3/2009 | Hillis et al. | |
| 7,525,207 B2 | 4/2009 | Clidaras et al. | |
| 7,529,086 B2 | 5/2009 | Fink et al. | |
| 7,604,535 B2 | 10/2009 | Germagian et al. | |
| 7,646,590 B1 | 1/2010 | Corhodzic et al. | |
| 7,701,714 B2 * | 4/2010 | Shabany | 361/698 |
| 7,752,858 B2 | 7/2010 | Johnson et al. | |
| 7,841,381 B2 | 11/2010 | Chagnot et al. | |
| 7,987,223 B2 * | 7/2011 | Garnett et al. | 718/100 |
| 2002/0007643 A1 | 1/2002 | Spinazzola et al. | |
| 2002/0055329 A1 | 5/2002 | Storck et al. | |
| 2003/0002254 A1 | 1/2003 | Faneuf et al. | |
| 2003/0133263 A1 | 7/2003 | Shu | |
| 2003/0150231 A1 | 8/2003 | Spinazzola et al. | |
| 2003/0181158 A1 | 9/2003 | Schell et al. | |
| 2003/0197428 A1 | 10/2003 | Hatton et al. | |
| 2003/0209023 A1 | 11/2003 | Spinazzola et al. | |
| 2003/0237008 A1 | 12/2003 | Freevol et al. | |
| 2004/0020224 A1 | 2/2004 | Bash et al. | |
| 2004/0020232 A1 | 2/2004 | Marquardt | |
| 2004/0054780 A1 * | 3/2004 | Romero | 709/226 |
| 2004/0090787 A1 | 5/2004 | Dowling et al. | |
| 2004/0095249 A1 | 5/2004 | Zaccaria | |
| 2004/0099747 A1 | 5/2004 | Johnson et al. | |
| 2004/0105758 A1 | 6/2004 | Ross | |
| 2004/0150374 A1 | 8/2004 | Kraus | |
| 2004/0184232 A1 | 9/2004 | Fink | |
| 2004/0223300 A1 | 11/2004 | Fink et al. | |
| 2005/0012395 A1 | 1/2005 | Eckroad et al. | |
| 2005/0036248 A1 | 2/2005 | Klikic et al. | |
| 2005/0088201 A1 | 4/2005 | Devlin | |
| 2005/0099750 A1 | 5/2005 | Takahashi et al. | |
| 2005/0099770 A1 | 5/2005 | Fink | |
| 2005/0168945 A1 | 8/2005 | Coglitore | |
| 2005/0170770 A1 | 8/2005 | Johnson et al. | |
| 2005/0225936 A1 | 10/2005 | Day | |
| 2005/0259392 A1 | 11/2005 | Vinson et al. | |
| 2006/0007653 A1 | 1/2006 | Fink | |
| 2006/0020832 A1 | 1/2006 | Hung | |
| 2006/0031448 A1 * | 2/2006 | Chu et al. | 709/223 |
| 2006/0065000 A1 | 3/2006 | Belady | |
| 2006/0082263 A1 | 4/2006 | Rimler et al. | |
| 2006/0139877 A1 | 6/2006 | Germagian et al. | |
| 2006/0187636 A1 | 8/2006 | Fink et al. | |
| 2007/0076373 A1 | 4/2007 | Fink | |
| 2007/0097636 A1 | 5/2007 | Johnson et al. | |
| 2007/0139883 A1 * | 6/2007 | Pinkerton et al. | 361/696 |
| 2007/0254583 A1 | 11/2007 | Germagian et al. | |
| 2007/0274035 A1 | 11/2007 | Fink et al. | |
| 2008/0062647 A1 | 3/2008 | Hillis et al. | |
| 2008/0064317 A1 | 3/2008 | Yates et al. | |
| 2008/0094797 A1 | 4/2008 | Coglitore et al. | |
| 2008/0123288 A1 | 5/2008 | Hillis | |
| 2009/0050591 A1 | 2/2009 | Hart et al. | |
| 2009/0195977 A1 | 8/2009 | Fink et al. | |
| 2009/0241578 A1 | 10/2009 | Carlson et al. | |

FOREIGN PATENT DOCUMENTS

| | | |
|---|---|---|
| EP | 621451 A3 | 8/1995 |
| WO | WO 2007082351 A1 | 7/2007 |

OTHER PUBLICATIONS

Supplementary European Search Report mailed Jun. 30, 2010 for international application No. 06785588.2, PCT/US2006/024845 (6 pages).

Extended European Search Report mailed dated Mar. 4, 2013 for international application No. 06785739.1 (9 pages).

"Protect High-Density Equipment From Thermal Damage—Guaranteed," *APC Currents*, 2007, 18(4), 3 pages.

'Circuit Converts PWM Fan Drive to Linear and Reduces Acoustic Noise' [online]. Maxim/Dallas Semiconductor, 2006, [retrieved on Oct. 23, 2006]. Retrieved from the Internet: <URL: www.maxim-ic.com/appnotes.cfm/an_pk/3530>. 3 pages.

'Intelligent Temperature Monitor and PWM Fan Controller' [online] Analog Devices, 2003, [retrieved on Oct. 24, 2006]. Retrieved from the Internet: <URL: www.analog.com/UploadedFiles/Data_Sheets/ADM1030.pdf#xml=http://search.analog.com/search/pdfPainter.aspx?url=http://www.analog.com/UploadedFiles/Data_Sheets/ADM1030.pdf&fterm=Intelligent&fterm=Temperature&fterm=Intelligent Temperature&la=en>. 28 pages.

'LM64—+− 1C Remote Diode Temperature Sensor with PWM Fan Control and 5 GPIO's' [online]. National Semiconductor, 2006, [retrieved on Oct. 23, 2006]. Retrieved from the Internet: <URL: http://www.elecdesign.com/Articles/Index.cfm?ArticleID=6281>. 3 pages.

(56) References Cited

OTHER PUBLICATIONS

'Low-cost fan manager for power-supply applications' [online]. Electronic Design, 2006, [retrieved on Oct. 23, 2006]. <URL: www.elecdesign.com/Articles/Index.cfm?ArticleID=6281>, 3 pages.

'T10 Project 1142D—Working Draft SCSI Parallel Interface-2' [online]. American National Standard, 1998, [retrieved on Oct. 23, 2006]. Retrieved from the Internet: <URL: www.t10.org/ftp/t10/drafts/spi2/spi2r20b.pdf >, pp. 181-182.

Cringley, Robert, "Google-Mart: Sam Walton Taught Google More About How to Dominate the Internet Than Microsoft Ever Did," I, Cringely—The Pulpit, Nov. 17, 2005, 3 pages.

Greg Matter Weblog, The Industrial Revolution, Finally, available at: http://blogs.sun.com/Gregp/date/200610, Oct. 17, 2006, 5 pages.

Hamilton, James, "An Architecture for Modular Data Centers" Microsoft Corp,CIDR 2007. 3rd Biennial Conference on Innovative Data Systems Research (CIDR) Jan. 7-10, 2007, Asilomar, California, USA pp. 306-313.

Hamilton, "Commodity Data Center Design" Microsoft Corp, Apr. 17, 2007, 11 pages.

Rackable Systems, "Rackable Systems Contcentro Modular Data Center High Density, High Efficiency Mobile Computing," Datasheet, 2007, 1 page.

Rackable Systems, "Thermal Management & Server Density: Critical Issues for Today's Data Center," White paper, 2004, 8 pages.

Sanmina-SCI Product Sheet, ECOBAY, "High-Performance Closed-Loop System," 2006, 2 pages.

Shankland, Stephen, "Sun Blackbox, meet APC's whitebox," cNet News.com, available at http://news.com.com/Sun+Blackbox%2C+meet+APCs+whitebox/2001-1010_3-617774.html, Jan. 7, 2007, 2 pages.

Sun Project Blackbox—Index, Available at: http://www.sun.com/emrkt/blackbox/index.jsp, Retrieved Oct. 19, 2006, 3 pages.

Sun Project Blackbox—Scenarios, Available at: http://www.sun.com/emrkt/blackbox/scenarios.jsp, Retrieved Oct. 19, 2006, 7 pages.

System Management Interface Forum, "PMBus Power System Management Protocol Specification Part 1—General Requirements, Transport and Electrical Interface, Revision 1.0" Mar. 2005, 17 pages.

International Search Report and Written Opinion in International Application No. PCT/US2006/25163, mailed May 3, 2007, 8 pages.

International Preliminary Report on Patentability in International Application No. PCT/US2006/024845, mailed Dec. 18, 2008, 7 pages.

International Search Report and Written Opinion in International Application No. PCT/US2006/024845, mailed Dec. 18, 2006, 9 pages.

International Search Report and Written Opinion in International Application No. PCT/US2006/24844, mailed Apr. 26, 2007, 10 pages.

International Preliminary Report on Patentability in International Application No. PCT/US2006/24844, mailed Dec. 18, 2008, 6 pages.

International Search Report and Written Opinion in International Application No. PCT/US2006/024880, mailed Feb. 15, 2008, 14 pages.

International Search Report and Written Opinion in International Application No. PCT/US2006/039928, report completed Mar. 25, 2007, 8 pages.

International Search Report and Written Opinion in International Application No. PCT/US2006/039715, mailed Nov. 5, 2007, 12 pages.

Supplementary European Search Report in European Application No. EP 0678558.2-1242, dated Jun. 30, 2010, 6 pages.

\* cited by examiner

MODULAR COMPUTING ENVIRONMENTS

CROSS-REFERENCE TO RELATED APPLICATIONS

This application is a continuation of, and claims the benefit of, U.S. patent application Ser. No. 12/815,892, entitled "Modular Computing Environments," and filed Jun. 15, 2010, now U.S. Pat. No. 8,218,322 which is a continuation of U.S. patent application Ser. No. 11/757,101, entitled "Modular Computing Environments," and filed Jun. 1, 2007, now U.S. Pat. No. 7,738,251 which claims the benefit of prior U.S. provisional application 60/810,451, entitled "Modular Computing Environments," and filed Jun. 1, 2006.

TECHNICAL FIELD

This description relates to modular computing environments.

BACKGROUND

Computers have become widely adopted for various applications, for both personal and corporate uses. Some computers operate as stand-alone data-processing equipment, with perhaps a peripheral such as a printer and a display device. Although useful for many purposes, additional features and benefits may be achieved if multiple computers are networked together to share information and resources.

A computer network may be formed by connecting two or more computing devices with a communication channel. One type of network is a local area network (LAN). A typical residential LAN, for example, may connect two computers to a printer. A typical corporate LAN, for example, may allow many users to share resources and large amounts of information, including databases and application software.

A second type of network is a wide area network (WAN). An example of a WAN is the Internet. WANs such as the Internet allow many computer devices to communicate messages and share information. When multiple LANs are interoperable with one or more WANs, opportunities for computing devices to communicate and share information greatly expand.

From the perspective of an individual computing device that is connected to a network, users may direct the communication of information over a network with a user interface generated by a web browser application. A web browser is typically configured to enable the user to access web sites on the Internet or the World Wide Web. Web browsers allow users to easily send and receive messages over a network in packets of information. Such packets of information may include the address of a search engine website, such as www.dogpile.com, for example.

The popularity and simplicity of sharing information over networks, such as the Internet, has resulted in demand for data processing and/or storage capacity to support high network traffic volume. One mechanism to address this need may be referred to as a data center. In the context of the Internet, a data center may provide one or more of processing, storage, and support functions that improve performance or enhance the utility of the Internet. Data centers may also be deployed in other contexts. Financial institutions, for example, may employ one or more data centers to store financial account and transaction information.

A data center may provide data processing and/or storage capacity. In operation, a data center may be connected to a network, and may receive and respond to various requests from the network to retrieve, process, and/or store data. In addition to extensive data processing and data storage capabilities, data centers typically support high speed data transfer and routing capabilities. To meet future network demands, data center capacity may continue to expand.

SUMMARY

A computer system (e.g., a data center) may include a connecting hub having a plurality of docking regions and be configured to provide to each docking region electrical power, a data network interface, a cooling fluid supply and a cooling fluid return; and a plurality of shipping containers that each encloses a modular computing environment that adds a predetermined or default amount of computing power to the system. Each shipping container may include a) a plurality of processing units (e.g., servers) coupled to the data network interface, each of which include a microprocessor; b) a heat exchanger configured to remove heat generated by the plurality of processing units by circulating cooling fluid from the supply through the heat exchanger and discharging it into the return; and c) docking members configured to releaseably couple to the connecting hub at one of the docking regions to receive electrical power, connect to the data network interface, and receive and discharge cooling fluid.

In some implementations, each processing unit may further include at least one storage device. The docking members may include quick-connect docking members. The connecting hub may include a spine; the connecting hub may include a ring.

In some implementations, a modular data center includes a connecting hub and a plurality of containers. The connecting hub may have a plurality of docking regions and may be configured to provide to each docking region electrical power, a data network interface, a cooling fluid supply and a cooling fluid return. Each container may enclose a modular computing environment having a plurality of computing devices that collectively add a large, predetermined amount of computing power to the modular data center. Each container may further have a) a first heat exchange circuit configured to transfer heat from the computing devices to a heat exchanger; b) a second heat exchange circuit comprising the heat exchanger, the cooling fluid supply and cooling fluid return, the second heat exchange circuit being configured to transfer heat from the heat exchanger inside of the container to a system outside of the container via cooling fluid in the cooling fluid supply and cooling fluid return; and c) docking members that releaseably connect to the spine at one of the plurality of docking regions to receive electrical power, connect to the data network interface, receive cooling fluid from the cooling fluid supply, and discharge return cooling fluid to the cooling fluid return.

In some implementations, each modular computing environment includes a) a plurality of microprocessor boards that receive power from the connecting hub and receive data from a network coupled to the data network interface, process the received data and transmit the processed data to the network via the data network interface; b) an air recirculating system that draws air from a cold air plenum adjacent to the plurality of racks, across the plurality of microprocessor boards, and into a warm air plenum. The heat exchanger may cool air from the warm air plenum and discharge the cooled air into the cold air plenum.

In some implementations, the modular computing environment may be configured to accommodate human occupancy. The modular computing environment may include a fire and smoke detection system and a fire suppression system. The modular computing environment may include an internal walkway and a means for ingress and egress at one or both ends of the walkway. The internal walkway may be disposed in the cold air plenum.

In some implementations, the air recirculating system may include a first set of fans and a second set of fans. Each fan in the first set may be disposed on one of the plurality of microprocessor boards, and each fan in the second set may be disposed adjacent to the heat exchanger. Adjacent fans in the second set may be supplied by electrical power from diverse electrical circuits.

In some implementations, the modular data center further includes a duct disposed between the heat exchanger and at least a first fan and a second fan in the second set. The duct may fluidly couple a region adjacent to the first fan and a region adjacent to the second fan. The plurality of microprocessor boards may be disposed in racks that are suspended from a ceiling of a corresponding container.

In some implementations, at least one of the plurality of containers may be stacked on top of another one of the plurality of containers. The modular data center may further include a facility-level cooling system that is disposed in the second heat exchange circuit, coupled to the cooling fluid supply and cooling fluid return. The facility-level cooling system may be configured to remove heat from cooling fluid in the cooling fluid return.

In some implementations, each container is sealed against environmental elements of wind and moisture. The modular data center may further include a normally sealed drain configured to open when in contact with an appreciable amount of liquid. In some implementations, at least two of the plurality of containers may be standard size shipping containers. The standard size may be a 1AAA shipping container. The standard size may be a 1CC shipping container.

In some implementations, a method of deploying a modular data center includes a) providing a cooling system configured to provide cooling fluid to various cooling devices, receive return cooling fluid from the various cooling devices and remove heat from the received return cooling fluid; b) providing an electrical power source; c) providing a data communication interface; d) routing electrical power from the electrical power source, a connection to the data communication interface, and a cooling fluid supply and cooling fluid return from the cooling system to a plurality of docking regions that each have stubs that are configured to couple the electrical power, cooling fluid supply, cooling fluid return and data communication interface connection to a modular computing environment; e) providing modular computing environments at least two of the plurality of docking regions, each modular computing environment configured to incrementally add computing power to a data center and including a plurality of computing resources and integrated cooling devices; and f) coupling each self contained computing environment at a corresponding docking region to the stubs to provide electrical power, cooling fluid supply and cooling fluid return, and connection to the data communication interface to the modular computing environment.

In some implementations, a method of processing data includes transmitting a request for data to a system and receiving data in response to the request. The system may include a) a connecting hub having a plurality of docking regions and configured to provide to each docking region electrical power, a data network interface, a cooling fluid supply and a cooling fluid return; and b) a plurality of shipping containers. Each shipping container may enclose a modular computing environment that adds a replacement amount of computing power to the computer system. Each shipping container may also have 1) a plurality of processing units that are coupled to the data network interface; 2) a heat exchanger configured to remove heat generated by the plurality of processing units from the shipping container by circulating cooling fluid from the cooling fluid supply through the heat exchanger and discharging heated cooling fluid into the cooling fluid return; and 3) docking members configured to releaseably connect to the connecting hub at one of the plurality of docking regions to receive electrical power, connect to the data network interface, receive cooling fluid from the cooling fluid supply, and discharge return cooling fluid to the cooling fluid return.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
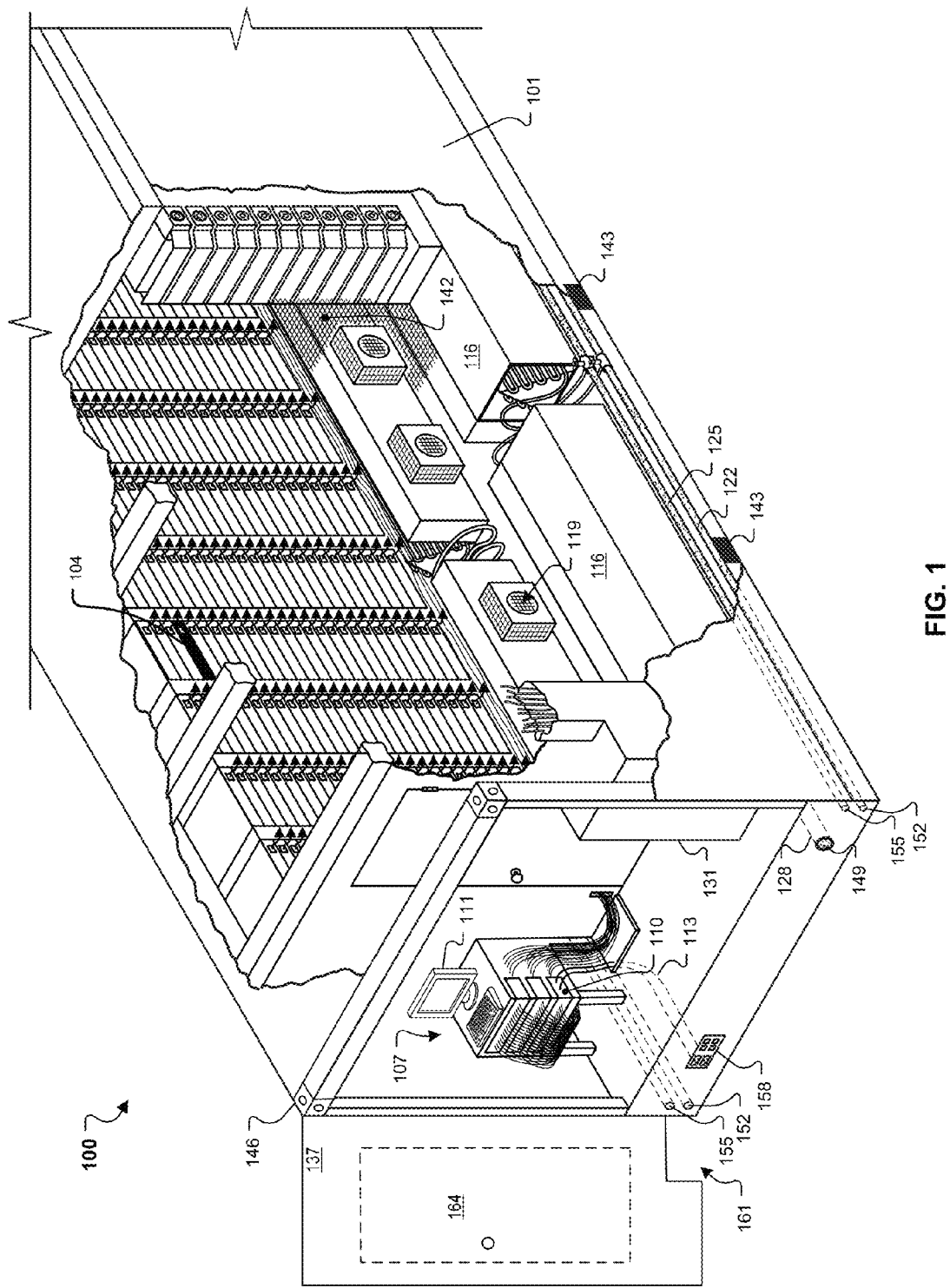
FIG. 1 is a perspective diagram of an example modular computing environment.

FIG. 1 is a perspective diagram of an example modular computing environment that can be configured to add computing power to a data center or other large computing system. The modular computing environment may include a large number of processing devices for executing computer program instructions and processing or routing data and a large data storage capacity for storing and retrieving data. Each modular computing environment may provide a large, predetermined or default amount of computing power (e.g., 2000 microprocessors and 5 petabytes of storage). In operation, the modular computing environment may be connected to a network, and may receive and respond to various requests from the network to retrieve data, process data or store data. In some implementations, more than one modular computing environment may be combined to form a massively parallel data center, and the massively parallel data center may be replicated at various physical locations. As used in this description, "massively parallel" refers to a distributed computer system having many individual nodes, each of which may be essentially an individual computer having, in some implementations, a processor, memory, and a storage device. The many individual nodes of the computer system may be linked together by a network to allow nodes to communicate with each other and to communicate with networks and devices external to the computer system. In some implementations, each node of the massively parallel system may be employed to execute a small part of a larger program, task or operation.

As one example application of a data center or other massively parallel computer system, a financial institution may employ a number of data centers at different physical locations to store customers' financial account and transaction information or to process various transactions. When a customer of the financial institution makes a withdrawal or deposit from a teller station, a computer programming running at the teller station may receive input from the teller identifying the customer's account and specifying the type and amount of the transaction; the computer program may then send information to one or more data centers to cause the customer's account to be adjusted to reflect the withdrawal or deposit. Because the data corresponding to the customer's account may be replicated in multiple physical locations, multiple data centers may be involved in the transaction.

At substantially the same time the first customer is making a withdrawal or deposit from a teller station, a second customer may be initiating online a transfer of funds or a payment of a bill from his or her home computer. A computer program running on a web server that is accessible from the second customer's home computer may also cause the second customer's account information to be updated at multiple data centers; these data centers may be the same or different data centers than those involved in the transaction of the customer making the withdrawal or deposit from the teller station.

Many other financial transactions involving other customers of the financial institution may take place substantially simultaneously, from various computer terminals within different physical offices of the financial institution and from various other computer terminals that access the financial institution's network from the outside (e.g., home or office computer terminals of customers accessing the financial institution's services via the internet). Accordingly, the data centers may be required to process in parallel a large number of transactions in a short amount of time. Such a requirement may translate into a need for a massively parallel computing environment having a large number of processors to execute code, a large storage capacity, and a high-bandwidth network interface.

As another example application, an online information provider that supplies content and services (such as a search engine function) to many users substantially simultaneously may employ a number of data centers at different physical locations to store the supplied content and data needed to provide the search engine service or to satisfy data access latency requirements or design parameters. Deploying multiple data centers that are relatively close to large numbers of users can be particularly advantageous for delivering time-sensitive content or applications. In addition, replicating data at different data centers in different locations can be an important part of a data security strategy. In the search engine example, some of the supplied content may be physically stored by the information provider's computing system; other data that may be identified in response to a user's invocation of the search engine function may be indexed by and in the information provider's computing system. In particular, various computer programs running on the information provider's computer system may automatically navigate or "crawl" networks such as the Internet to identify and index information that has not yet been indexed or that has been updated since last being indexed. The indexing process may involve temporarily retrieving the information, parsing and analyzing it to identify a theme or topic, and storing a corresponding source identifier of the information based on the theme or topic in an information retrieval tool such as a database or hash table.

An online information provider may be required to handle a very large volume of simultaneous data traffic. For example, the information provider's computing system may receive numerous requests at approximately the same time from computer terminals of users attempting to employ the information provider to locate sources of information corresponding to particular topics. Computer programs running on the information provider's computing system may receive, parse and analyze the various requests; convert them into an appropriate format; submit them to interfaces corresponding to the information retrieval tool; receive responses from the information retrieval tool identifying content sources that store information corresponding to the requests; and transmit data associated with the content sources to the computer terminals from which the requests were originally received.

In some implementations, the transmitted data may include a pointer (e.g., a hyperlink) to the corresponding information. In some implementations, the transmitted data may include a "snippet," or a portion, of the corresponding information (e.g., a sentence fragment from a document that includes a search term submitted with a request). In the latter case, in which a snippet is included with data transmitted to a computer terminal in response to a request received from that search terminal, snippets corresponding to various indexed information may be stored in the index or in other data storage facilities associated with the index or with the information provider.

In order to simultaneously receive and process a large number of requests from users for search engine services, the information provider may need a massively parallel computing environment having a large number of processors to execute code, a large storage capacity, and a high-bandwidth network interface.

As another example, one or more modular computing environments may be used as a high-volume "portable" data storage device. Large quantities (e.g., tens of terabytes) of frequently accessed data may be copied to one or more modular computing environments, and the modular computing environments may be transported (e.g., by cargo ship, truck or train) to a point of use. As a more concrete example, an insurance company may employ a modular computing environment to create a temporary claims office at the site of a major natural disaster. In particular, following, for example, a severe hurricane, an insurance company may store information about its policyholders in a modular computing environment and transport the modular computing environment to the site of the hurricane to create a temporary claims office. In such implementations, pre-loading large amounts of data in a modular computing environment may be more efficient or cost effective than remotely accessing the data, or transferring the data to other devices at or near the hurricane site.

As another example, one or more modular computing environments may be used as a laboratory network to simulate, in a test environment, a large network such as an enterprise intranet or a portion of the Internet. The modular computing environment may provide enough processing power and storage capacity to mimic a live network, while still remaining disconnected from live systems or live data; such an application may provide network equipment designers or manufacturers an opportunity to test or validate new hardware designs in an environment that approximates the intended operating environment without disrupting actual live data. Various components and aspects of massively parallel computing environments that may be used in the example applications outlined above are described in detail with reference to the figures.

FIG. 1 illustrates a modular computing environment 100 that may be used to add computing power to a massively parallel computing system, such as, for example, a data center. In some implementations, different modular computing environments ("modules") may provide a replacement amount of processing power or storage capacity (e.g., 2000 microprocessors and 5 petabytes of storage). That is, different modules may be substantially interchangeable. In some implementations, different modules may provide different ratios of processing power to storage capacity, and the target application may determine the appropriate ratio. For example, storage-intensive applications may call for modules that have a large number of storage devices, but the applications may not require a large number of processors; "lab network" applications designed to simulate large networks offline may call for modules with a large number of processors, but the applications may not require a large number of storage devices.

As shown, the modular computing environment 100 includes various computing resources, an integrated cooling system, an integrated power distribution system, and an integrated networking interface. In some implementations, the modular computing environment 100 is easily transported, protected from environmental elements and thus suitable for use both inside or outside a building, configured to be easily and quickly connected with other modular computing environments to form larger computing systems, and easily serviced by human operators. For example, in some implementations, as shown, the modular computing environment is protected by an enclosure 101, such as a shipping container. The enclosure is sealed on the outside from environmental elements and equipped with access to the interior for human operators to service the various computing resources.

The computing resources of the modular computing environment 100 include a large number of processor boards. As used in this description, "processor board" refers generally to a board that includes computing resources. In some implementations, as described in greater detail with reference to FIG. 8, each processor board may include one or more microprocessors for executing computer program instructions, dynamic memory for use while executing the computer program instructions, storage devices for storing persistent data, and an interface to link the processor board with other processor boards and with one or more networks. As described above, a target application may determine an appropriate ratio of processors to storage devices. In some implementations, a processor board may include only storage devices and corresponding controller(s) and may omit general-purpose microprocessors or general-purpose dynamic memory.

The processor boards may be physically disposed in racks, and racks carrying processor boards may substantially line the modular computing environment along the length of one or both sides of the enclosure. For example, in some implementations, the modular computing environment may include well over 1,000 processor boards. As shown in FIG. 1, the shaded region 104 represents a single processor board. The processor board 104 may be designed to be easily removed from the corresponding rack in order to be serviced. For example, the board 104 may be configured to slide along rails to facilitate easy servicing or replacement of the board 104.

Each processor board may be coupled to a network internal to the modular computing environment, and each processor board may further be accessible from a network external to the enclosure. In some implementations, the network internal to the modular computing environment includes a patch panel 107. The patch panel 107 may provide access connections (e.g., an RJ-45 Ethernet jack or optical interface) to network interfaces on each processor board, and the access connections may be coupled to the processor board network interfaces by, for example, category 5 or category 6 cable or fiber optic cable. The network may further include a router 110 to digitally route data from a high-bandwidth data connection external to the enclosure to processor boards within the enclosure. The network may also include one or more switches (not shown) to digitally route data from one processor board in the enclosure to another processor board in the enclosure.

A high-bandwidth connection 113 may couple the patch panel to one or more network interface connections 158 configured to connect to a network external to the modular computing environment 100. The high-bandwidth connection 113 may include one or more high-speed copper interfaces or one or more optical interfaces. For example, the high-bandwidth connection may include a gigabit Ethernet access point for balanced twisted-pair copper wire and an optical interface for connection to single- or multi-mode optical fiber. In particular, the high-bandwidth network connection may include a 10-gigabit Ethernet interface for coupling single-mode optical fiber carrying SONET (synchronous optical network signals) at carrier level 192 (OC-192) to an optical router 110.

In some implementations, a monitor/control terminal 111 may be provided to allow a human operator to monitor the various connections on the patch panel 107, switches or router 110, or to monitor actual data traffic. In some implementations, the monitor/control terminal 111 may enable a human operator to dynamically switch interconnections between various processor boards within the modular computing environment 100, or connections between an external network and various processor boards.

During operation, the computing resources may generate a significant amount of heat within the enclosure 101, and as such, the modular computing environment 100 includes an integrated cooling system to remove the generated heat from the enclosure 101. In some implementations, the integrated cooling system includes a number of heat exchangers 116 and a number of fans or pumps 119 to circulate cooling fluid (e.g., water or refrigerant) and/or fluid to be treated (e.g., air) through the heat exchangers 116. In particular, the heat exchangers 116 may be liquid-air heat exchangers that transfer heat in air that is cycled through them to a cooling fluid that is also cycled through the heat exchangers 116. The cooling fluid may be cycled through a system external to the enclosure 101, where the heat may be removed. Each heat exchanger 116 may be supplied with cooling fluid from a cooling fluid supply line 122; cooling fluid that has been warmed by the heat exchanger 116 may be discharged into a cooling fluid return line 125. Additional details of cooling systems are provided with reference to other figures.

The modular computing environment 100 also includes a power distribution system that receives power from outside the enclosure and distributes it to various loads within the enclosure. Power may be received through a connection 128 to an external power supply. Once inside the enclosure, the power may be routed to a power distribution box 131 and distributed through a number of circuits to power the computing resources, cooling system, network switching equipment and other electrical loads within the enclosure 101. The power distribution box 131 may include various circuit breakers or other over-current protection for each circuit, and each circuit may also include surge suppression devices or filters to smooth out the power or to prevent high frequency noise generated within the enclosure from being coupled into the power supply outside the enclosure. Individual circuits may be designed to minimize disruptions caused by failure of a single circuit. Additional details of an example power distribution system are provided with reference to other figures.

In order for the modular computing environment 100 to be serviced, the interior of the enclosure 101 may need to accommodate human occupancy; this may require additional features that satisfy both physical human occupancy requirements and any legal or safety requirements that may exist (e.g., municipal building or occupancy requirements). For example, the modular computing environment 100 may include interior lights, a source of fresh air, fire detection and suppression systems, provisions for safe ingress and egress of human occupants; and temperature, humidity and noise may be controlled to be within certain ranges.

Additional structural details of the example modular computing environment 100 are now described. As mentioned above, the modular computing environment 100 is protected by an enclosure 101 that is sealed from environmental elements such as, wind, rain or snow. In some implementations, the enclosure 101 is a standard shipping container. For example, the enclosure may be an ISO 1AAA container, sometimes referred to as a "high cube" 40' container, having an approximate inside width of 7'8", an approximate inside height of 8'10", and an approximate inside length of 39'5". Other container dimensions are possible. In particular, the modular computing environment 100 may be enclosed by a standard height 20' container (e.g., an ISO 1CC container having an inside height of approximately 7'10" and an inside length of 19'4"); or the container may be longer (e.g., 45', 48' or 53'). Moreover, enclosures other than shipping containers may be used. For example, in some implementations, the enclosure may be a metal- or wood-framed enclosure with protective siding material. Racks within the enclosure 101 may be suspended (e.g., from the ceiling or wall, to provide additional space under the racks for running cables, installing other equipment (e.g., cooling equipment) or providing addition service access), and the walkway 142 may be segmented into small, removable sections to facilitate access to the components under the racks (e.g., heat exchangers 116 or fans 119).

The enclosure 101 may be configured to be easily transportable. Shipping containers are particularly well-suited for this purpose and are designed to be easily transported, for example, by a cargo ship, train or truck. The enclosure may also be stackable and may include locking mechanisms (not shown) to secure multiple enclosures in a stacked arrangement (e.g., in operation). The enclosure may include fork-lift pockets 143 and corner fittings 146 to facilitate handling by cargo transport devices (e.g., fork-trucks, cranes, overhead booms, conveyors, etc.).

In some implementations, a modular computing environment 100 may be transported to a desired location and immediately deployed by being connected to an electrical power supply, a cooling system and a network interface, as described in greater detail below. In some implementations, a modular computing environment 100 may be deployed while it is still disposed on a transport device. For example, a modular computing environment 100 may be transported to an intended deployment site by cargo ship, train or truck, and the modular computing environment may be connected to electrical power a cooling system and a network while it is still on the cargo ship, train or truck. In general, the modular computing environment 100 may be configured to be rapidly deployed.

The modular computing environment 100 includes ports that facilitate quick connection to utilities and other services required for operation. For example, as shown in FIG. 1 and described above, a power port 149 is provided to supply power to the modular computing environment 100 via the power supply connection 128, cooling fluid supply port(s) 152 are provided to connect to the cooling fluid supply line(s) 122, cooling fluid return port(s) 155 are provided to connect to the cooling fluid return line(s) 125, and one or more network interface connections 158 are provided to couple an external network to the modular computing environment 100 via the high-bandwidth connection 113. In some implementations, openings 161 may be disposed in exterior doors 137 (left door 137 shown) of the enclosure 101 to allow access to the various ports 149, 152, 155 and 158 when the doors 137 are either opened or closed. In some implementations, the various ports 149, 152, 155 and 158 are provided in a location that is unaffected by operation of any exterior doors 137 (e.g., at the top or side of the enclosure 101). In some implementations, the enclosure 101 includes a second, smaller door 164 cut into an exterior door 137 such that the exterior door 137 may remain closed and sealed at all times. Seals (not shown) may protect the ports to keep moisture and particulates out of the interior of the enclosure. For example, the ports may include bladder seals, grommets or flexible dust covers.

Modular computing environments 100 with protective enclosures 101 as described above may have several benefits. For example, such modular computing environments 100 may facilitate quick assembly of large data centers. Large portions of a data center may be prefabricated and quickly deployed; in particular, portions of data centers may be constructed in parallel, rather than in sequence. Critical portions of data centers may be mobile and easily transported from one site to another. Portions of the data center may be manufactured by manufacturing labor, rather than constructed by trade labor (e.g., in a controlled manufacturing environment rather than in an uncontrolled construction site), possibly resulting in reduced costs.

Figure 2:
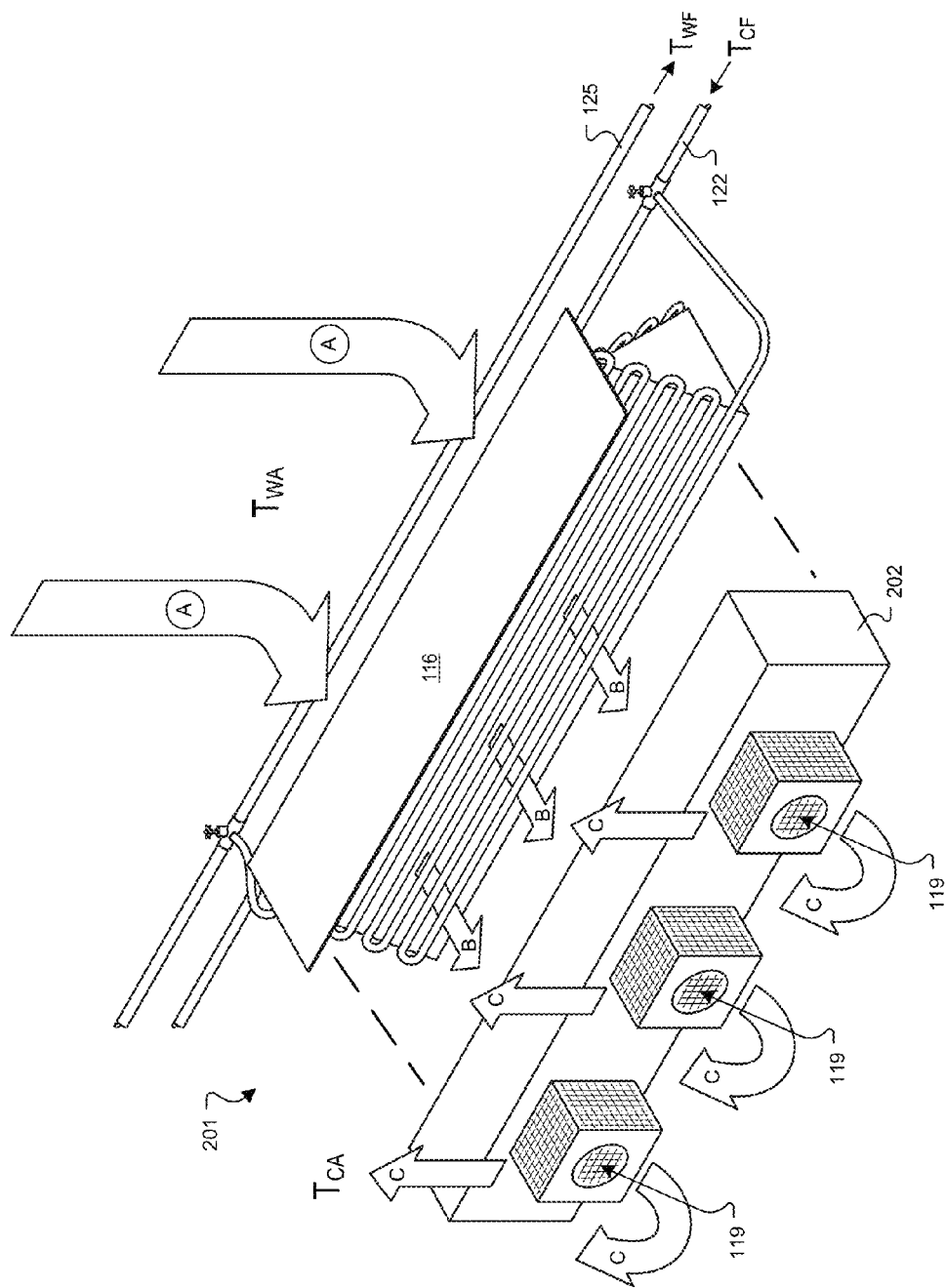
FIG. 2 is perspective diagram of an example cooling system that may be included in the modular computing environment that is shown in FIG. 1.

FIG. 2 is a perspective diagram further illustrating details of a portion 201 of an example cooling system ("cooling system 201") that may be included in the modular computing environment 100 that is shown in FIG. 1. As shown, the cooling system 201 includes a liquid-air heat exchanger 116 that is coupled to a cooling fluid supply line 122 and a cooling fluid return line 125. In operation, a cooling fluid is circulated from the cooling fluid supply line 122, through the heat exchanger 116, and discharged into the cooling fluid return line 125. Heat in air passing through the heat exchanger (e.g., via paths A and B) may be removed and transferred to the cooling fluid. For example, cooling fluid may have temperature $T_{CF}$ in the cooling fluid supply line 122, before being circulated through heat exchanger 116. After the cooling fluid has been circulated through heat exchanger 116, the cooling fluid may have a temperature of $T_{WF}$, increased from $T_{CF}$ by the transfer of heat from the air. Air passing through the heat exchanger may have a warm input temperature $T_{WA}$, and a cooled output temperature $T_{CA}$.

To move air through the heat exchanger 116 from an input region (corresponding to path A) to an output region (corresponding to path C), the cooling system 201 includes multiple fans 119. The fans 119 may be mounted to a duct 202 that fluidly couples a space in front of the heat exchanger 116. The duct 202 may help to balance variations in pressure along the duct's length; in addition, the duct 202 may improve the overall reliability of the cooling system 201 by pulling a large volume of air through the heat exchanger 116, even if one of the fans 119 stops functioning. For example, even if a middle fan 119 stops functioning, the duct 202 may even out pressure variations relative to the outside fans 119 that may otherwise exist and pull air through the middle of the heat exchanger 116. As shown, the fans 119 pull air through the heat exchanger 116, but in other implementations, fans may be disposed such that they push air through the heat exchanger 116.

An overall cooling system may include other portions, in addition to the portion 201 that is illustrated in FIG. 2. For example, a cooling system may include a line of heat exchangers 116 disposed along the length of each side of the enclosure 101; some heat exchangers may be disposed vertically, for example, in place of one or more racks. As depicted, the cooling system may include a duct 202 and a set of fans 119 to correspond to each heat exchanger 116. The duct 202 may be segmented and may correspond to the length of heat exchanger 116, or the duct 202 may be continuous along a larger portion of the length of the enclosure 101. More or fewer fans 119 may correspond to each heat exchanger 116, and the length of individual heat exchangers 116 may vary. In some implementations, each heat exchanger 116 is about 8' in length and corresponds to 3 motorized impeller fans. Other arrangements are contemplated. For example, air movers other than the fans 119 may be employed, and heat exchangers having designs other than the design depicted by the heat exchanger 116 may be used. Moreover, fans or other air movers may be disposed at locations other than the example locations shown in FIG. 2, such as, for example, above or behind the racks.

Figure 3:
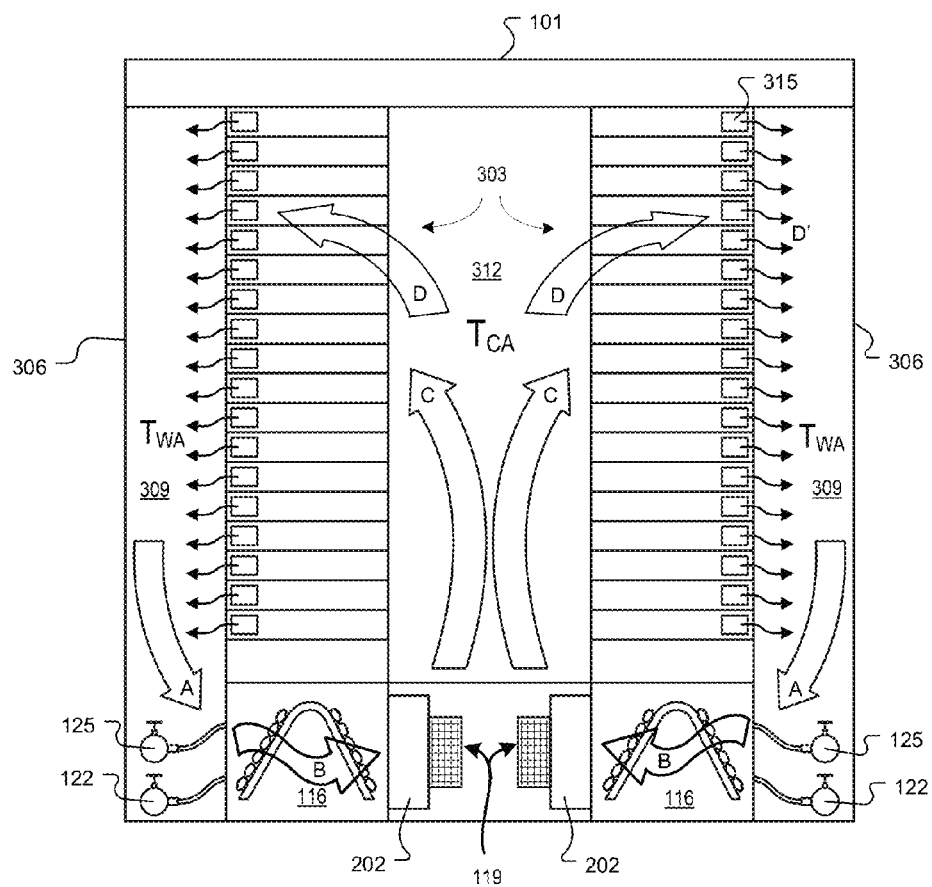
FIG. 3 is a cross-section of the example modular computing environment that is shown in FIG. 1.

FIG. 3 is a cross-section of the example modular computing environment 100 that is shown in FIG. 1. FIG. 3 illustrates an example flow of air through the modular computing environment 100. As shown in FIGS. 1 and 3, racks 303 of processor boards are disposed along much of the length of the enclosure 101. The racks 303 are spaced apart from exterior sidewalls 306 of the enclosure, forming an open space, or warm air plenum 309. A "cold air plenum" 312 may be formed by the interior space between the racks 303. In some implementations, air flows between the cold air plenum 312 and the warm air plenum 309 in one of two ways: cold air flows from the cold air plenum 312 to the warm air plenums 309 by flowing through the racks 303, across the processor boards (e.g., via paths C, D, A); warm air from the warm air plenums 309 moves to the cold air plenum 312 by flowing through the heat exchangers 116 (via path A, B, C). As the air flows over the processor boards (via path D), it absorbs heat generated by the processing boards, and its temperature may rise from $T_{CA}$ in the cold air plenum 312 to $T_{WA}$ in the warm air plenum 309. Conversely, as the air flow through the heat exchanger 116, heat is removed and transferred to the cooling fluid; the temperature of the air may drop from $T_{WA}$ to $T_{CA}$, as a result, while the temperature of the cooling fluid circulating through the heat exchanger may rise from temperature $T_{CF}$ to $T_{WF}$. In some implementations, processor boards may include a fan (e.g., fan 315) to cool components on the processor board and/or to minimize thermal inconsistencies within the warm air plenum 309 or cold air plenum 312.

Figure 4:
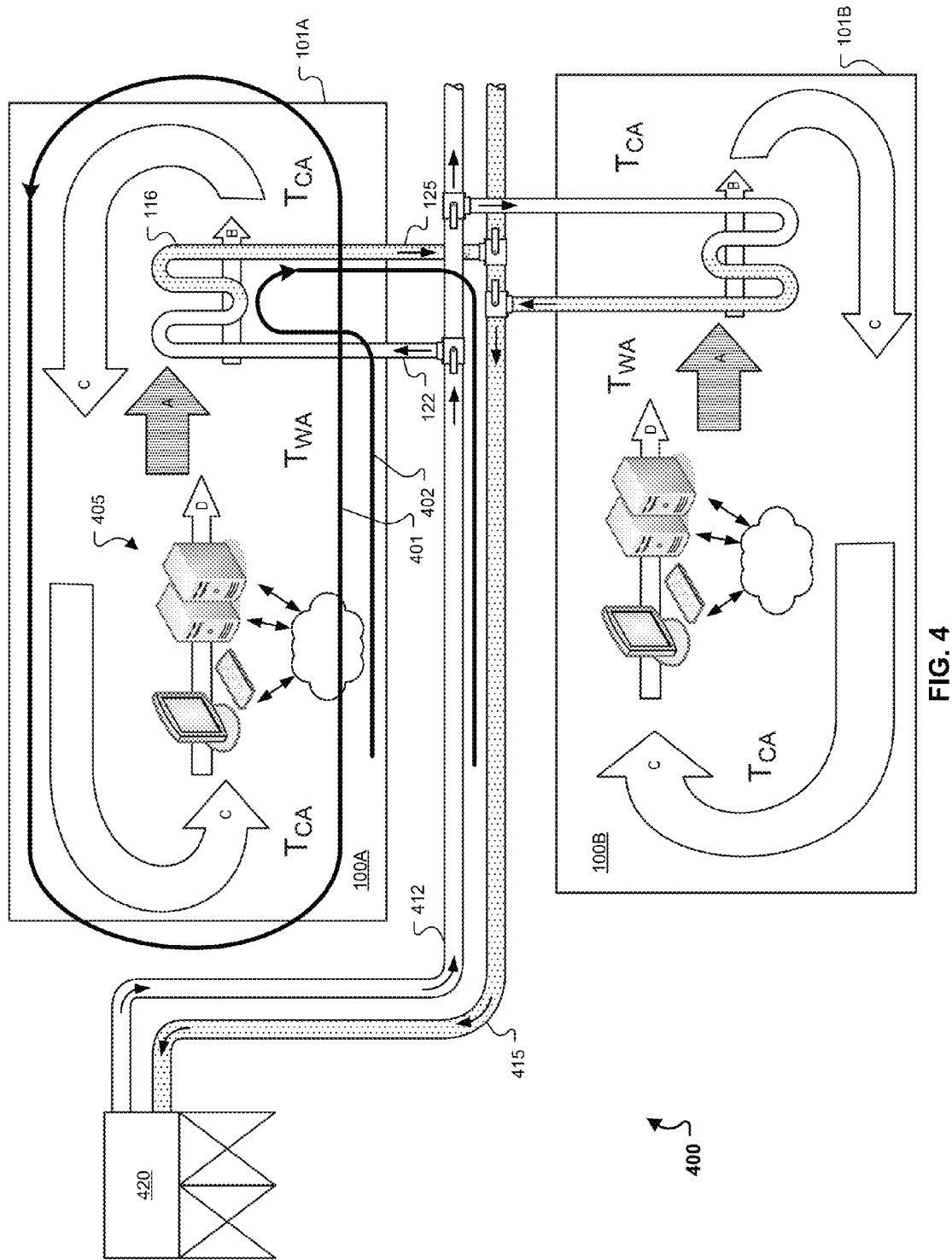
FIG. 4 is a block diagram showing example thermal circuits that may exist in a modular data center.

FIG. 4 is a block diagram illustrating example thermal circuits 401 and 402 that may exist in a modular data center 400. As used in this context, "thermal circuit" refers to a path through which heat flows. The thermal circuits 401 and 402 may operate to remove heat that is generated inside enclosures 101A and 101B that protect and enclose modules 100A and 100B of the data center 400 (e.g., modular computing environments). A first thermal circuit 401 may transfer heat from a first medium (e.g., air) to a second medium (e.g., water) within the enclosure 101A; a second thermal circuit 402 may remove heat from the second medium external to the enclosure 101A. A third thermal circuit may be employed (e.g., within an external cooling system 420) to, for example, isolate process water from cooling water in water-based implementations.

As shown, the modular data center 400 includes two modular computing environments 100A and 100B. (The modular data center 400 may include many other modular computing environments, but only two are shown for purposes of illustration.) The modular computing environments 100A and 100B include a number of computing devices 405 that generate heat within the enclosure 100A. Air may be circulated past the computing devices 405 to absorb the generated heat (e.g., via path D). The modular computing environment also includes one or more integrated heat exchangers 116, through which the air may be circulated to remove the absorbed heat (e.g., via path B). In some implementations, as described above, the heat exchanger 116 is a liquid-air heat exchanger in which heat removed from the air is transferred to a cooling fluid circulated through the heat exchanger 116 (e.g., via supply and return lines 122 and 125).

As shown, the transfer of heat from the computing devices 405 to air and from air to cooling fluid comprises a first thermal circuit 401. In some implementations, the amount of heat generated by the computing devices 405 is substantially equivalent to the amount of heat transferred to the cooling fluid (ignoring heat received or dissipated through walls of the enclosure 101A). In these implementations, substantially all of the generated heat may be removed by a second thermal circuit 402.

As shown, the second thermal circuit 402 includes the cooling fluid supply line 122, a cooling fluid supply main 412 that provides cooling fluid to multiple modular computing environments 100A and 100B, the cooling fluid return line 125, a cooling fluid return main 415 that receives cooling fluid from multiple modular computing environments 100A and 100B, and a cooling system 420 (e.g., a refrigeration-based chiller or condenser, an evaporative cooling tower, or another heat exchanger or heat pump). In operation, the second thermal circuit 402 may function at a facility level (e.g., the entire modular data center 400) to exhaust heat from multiple modules (e.g., the modular computing environments 100A and 100B). Other types and arrangements of the cooling system 420 are possible.

Figure 5:
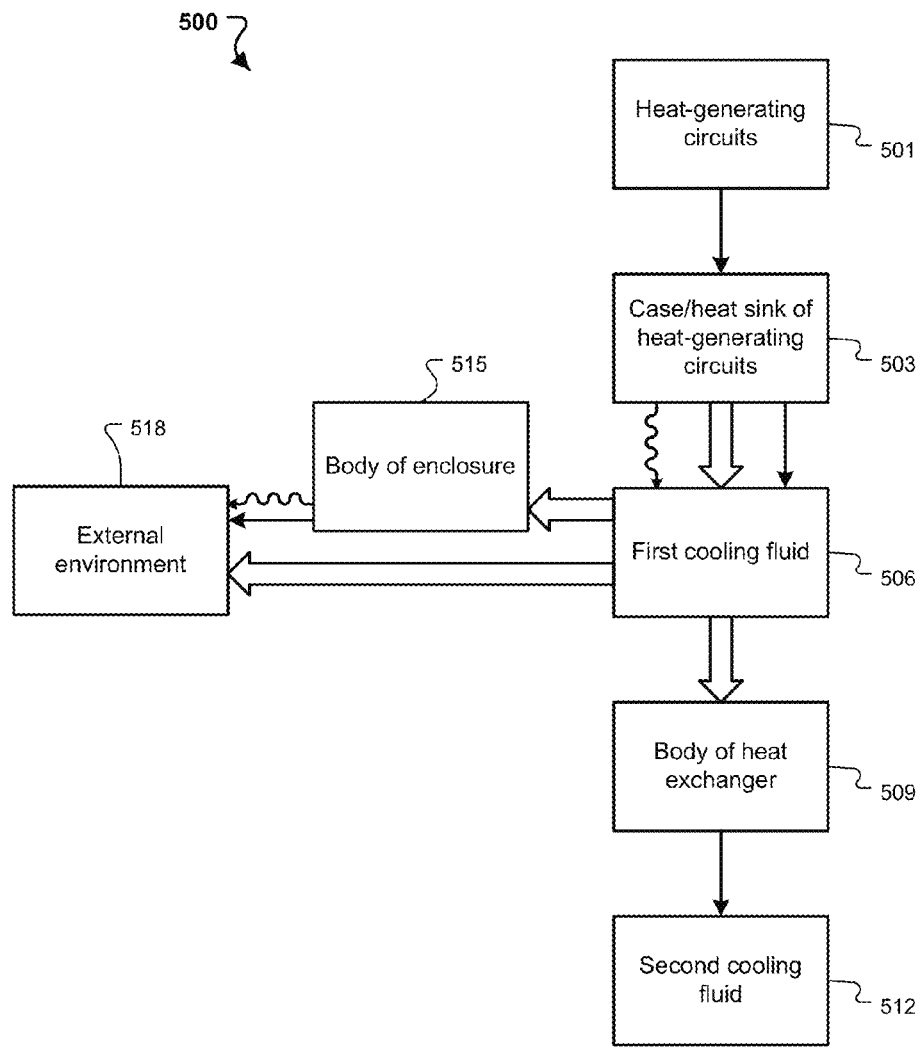
FIG. 5 is a another block diagram showing example thermal circuits that may exist in a modular computing environment.

FIG. 5 is another block diagram 500 showing example heat-generating circuits 501 that may exist in the modular computing environment 100. FIG. 5 depicts a few pathways by which heat can flow within an example modular computing environment but is not intended to describe in detail all possible pathways or modalities (e.g., radiative, conductive, convective). Various electrical circuits 501 generate heat. The heat-generating circuits 501 may include, for example, processing components (e.g., microprocessors, memory, storage devices, etc.) within the modular computing environment 100 (in particular, within the enclosure 101 of the modular computing environment 100). Heat from the heat-generating circuits 501 may be conducted to a corresponding component case or heat sink 503. For example, heat generated within a microprocessor's circuits may be conducted to a surface (case) of the microprocessor, or to a heat sink that is attached to the microprocessor. Conduction is depicted in FIG. 5 by a thin, straight arrow. From the case or heatsink ("case") 503, the heat may be radiated, convected or conducted to a first cooling fluid 506, or radiated to the environment (not shown). In FIG. 5, radiation is depicted as a wavy arrow, and convection is depicted by a larger, open arrow. In some implementations, the first cooling fluid is air. The first cooling fluid 506 may be circulated within the enclosure 101 of the modular computing environment 100, and as the first cooling fluid 506 is circulated, the heat stored therein may be convected to the walls of the enclosure 101. The first cooling fluid 506 may be circulated to a heat exchanger (e.g., heat exchanger 116), and the heat may be transferred to the body of the heat exchanger 509 by convection. By a process of conduction, the heat may be transferred from the body of the heat exchanger 509 to a second cooling fluid 512 within the heat exchanger, where it can be removed, for example by a circulation process of the cooling fluid to another heat exchanger that is external to the enclosure.

In some implementations, heat may flow in other ways. For example, some heat may be exhausted from the enclosure 101 corresponding to the modular computing environment 100 by advection, e.g., through a fresh-air ventilation system to an external environment 518. In many implementations, such heat transfer has only second-order effects relative to the primary transfer of heat to the second cooling fluid 512; that is, the transfer of heat from the heat-generating circuits 501 to the external environment 518 by first cooling fluid 506 that leaves the enclosure may be negligible vis-à-vis the transfer of heat from the heat-generating circuits to the second cooling fluid 512. As another example, some heat may be transferred to the body 515 of the enclosure 101 by convection, and then transferred from the body 515 of the enclosure 101 by conduction or radiation. In many implementations, this form of heat transfer also only has second-order effects relative to the primary transfer of heat to the second cooling fluid 512; that is, the transfer of heat from the heat-generating circuits 501 to the external environment 518 by radiation from the body 515 of the enclosure may be negligible vis-à-vis the transfer of heat from the heat-generating circuits to the second cooling fluid 512.

For simplicity, the description above accounts for heat transfer out of the enclosure 101. However, in some implementations, heat may also enter the enclosure 101 from the external environment. For example, heat may be transferred by convection or radiation to the body 515 of the enclosure 101, and from the body 515 of the enclosure 101 to the first cooling fluid 506. In many implementations, such heat transfer also has only second-order effects, and a detailed description is therefore omitted.

Figure 6:
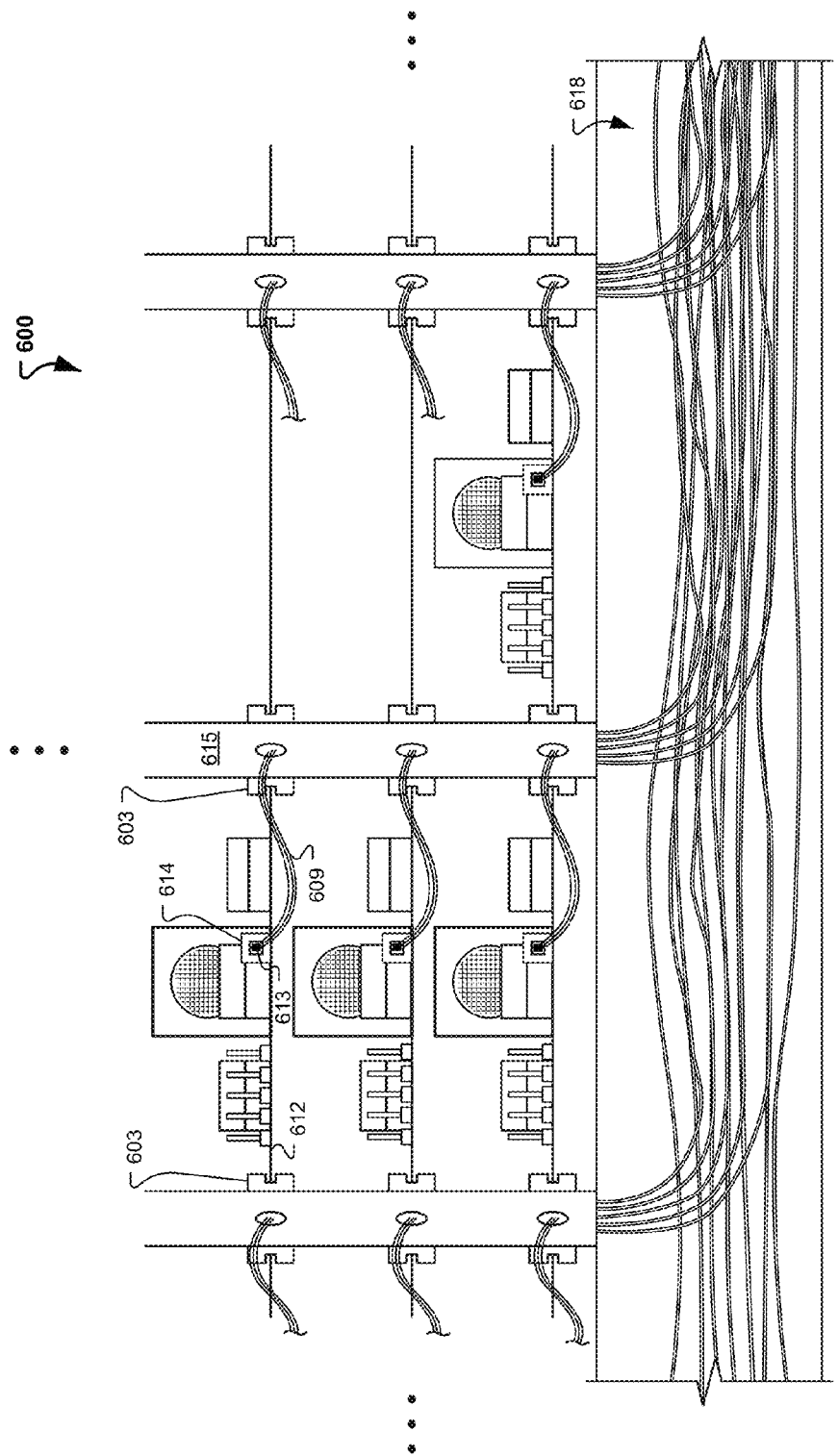
FIG. 6 provides a front view of an example rack.

FIG. 6 is a front view of an example rack 600. As shown, the rack 600 includes a plurality of rails 603 configured to support processor boards (e.g., servers). The processor board 612 may be removed from the rails 603 for service or anchored by the rails 603 for normal operation.

In some implementations, a cable 609 (e.g., a Category 5, Category 6, or optical fiber cable) may couple a network interface on a processor board to the patch panel 107 (see FIG. 1), a switch, or the router 110, in order to make the processor board accessible to the modular computing environment. In some implementations, the cable 609 connects to the processor board via an RJ-45 plug 613 and jack 614. In some implementations, the cable 609 may be routed through a rack support 615 and across a cable tray 618 to the patch panel 107, switch or router 110. The cable tray 618 may be disposed along the bottom of the rack, as shown, or it may be disposed elsewhere (e.g., under the walkway, along the ceiling, etc.) In some implementations, as shown, the cable 609 may be continuous from the processor board to the patch panel 107; in other implementations (not shown), a short patch cable may connect each processor board to another plug disposed on the rack support 615, and another cable may connect the plug to the patch panel 107, switch or router 110.

Figure 7:
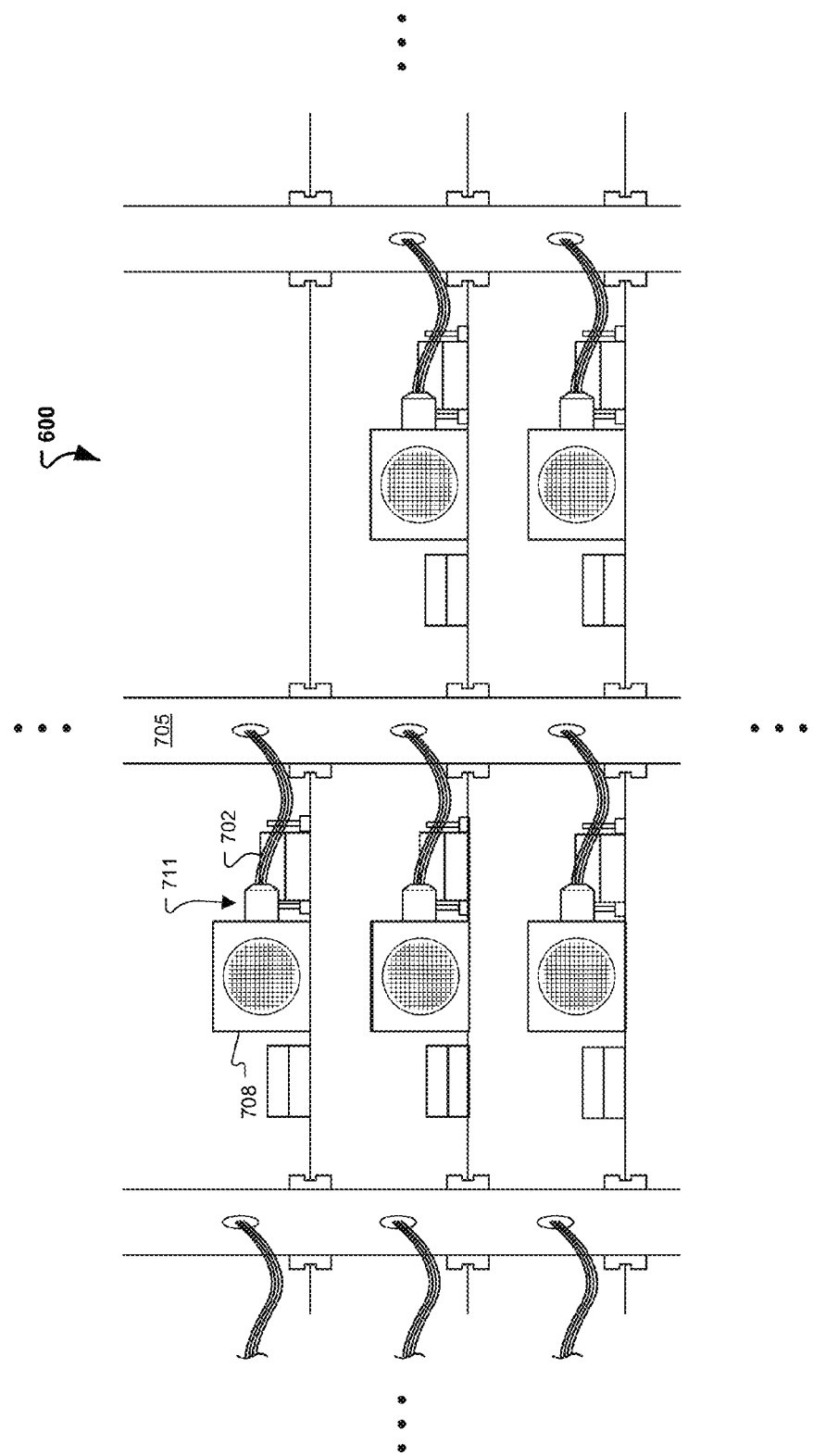
FIG. 7 provides a rear view of an example rack.

FIG. 7 is a rear view of the example rack 600 that is shown in FIG. 6. FIG. 7 illustrates how power may be delivered to each processor board, in some implementations. As shown, a power cable 702 is routed through a rack support 705 and connects to an on-board power supply 708 with a plug (not shown) that is integral to the power supply 708 and a receptacle 711. Other implementations are contemplated. For example, in some implementations, power is routed to the front of each processor board (e.g., such that power and data connections are accessible from the same side of the processor board). In some implementations, a short pigtail connector (not shown) couples the receptacle 711 on the power supply 708 to a receptacle on the rack, e.g., to facilitate quick connection/disconnection of power to individual processor boards.

In some implementations, the power cable 702 is connected to a circuit that is split out in the power distribution box 131 (e.g., a 277 VAC, single-phase circuit). In some implementations, power is distributed from the power distribution box 131 to various rack supports along the top of the rack; in other implementations, power may be distributed in a different manner (e.g., via buses, along the bottom of the rack, under the walkway, to the front of the racks etc.)

Figure 8:
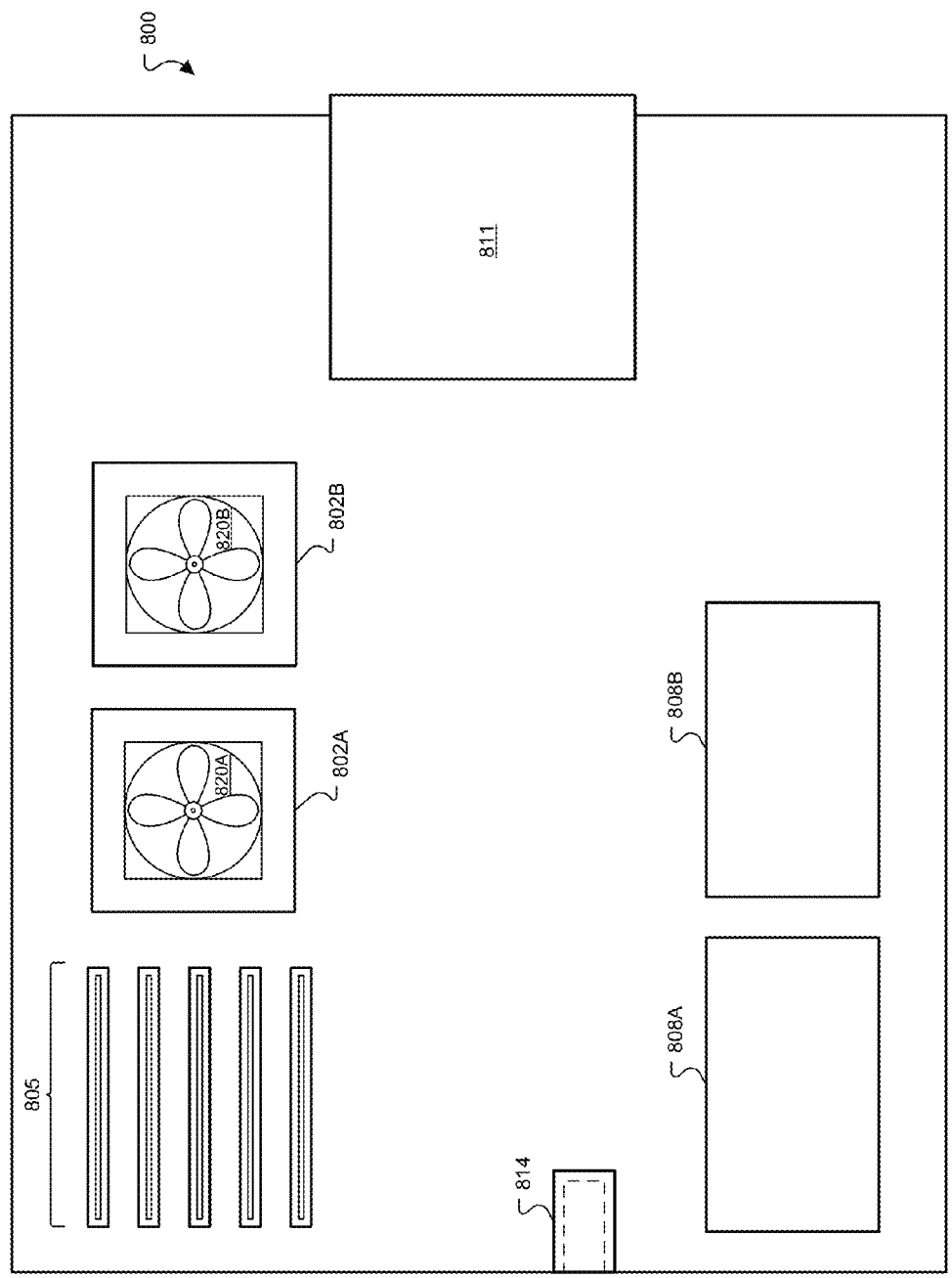
FIG. 8 is a block diagram of an example processing board that may be included in a modular computing environment.

FIG. 8 is a block diagram of an example processor board 800 that may be included in the modular computing environment 100. As shown, the processor board 800 may include one or more processors 802A and 802B, on-board memory 805, and one or more on-board storage devices 808A and 808B. The processor board 800 also includes an on-board power supply 811 that receives power from an external source—for example as shown in FIG. 7. In some implementations, the power supply 811 includes a fan that facilitates cooling of the processor board 800 and that may help minimize thermal inconsistencies elsewhere in an overall system. In some implementations, a fan or other cooling device can also be included with each processor (e.g., fan 820A with processor 802A and fan 820B with processor 802B). One or more network interfaces (e.g., a network interface 814) allows the processor board 800 to be coupled to other devices within the modular computing environment 100 or within a larger network.

In operation, the processor board 800 may execute computer program instructions that are stored in the storage devices 808A or 808B or memory 805, or that are received via the network interface 814. In multi-processor implementations, each processor 802A or 802B may independently execute instructions, and each processor 802A or 802B may have corresponding dedicated memory or storage devices. The instructions may, for example, cause the processors to retrieve data from the storage devices 802A or 802B and provide it to another device coupled to the network interface 814, process data, or store data in the storage devices 802A or 802B or memory 805. A large data center may employ thousands of processor boards such as the processor board 800 to perform complex data manipulations, such as, for example, managing customer account information within a financial institution, or providing various users with content and information services.

Figure 9:
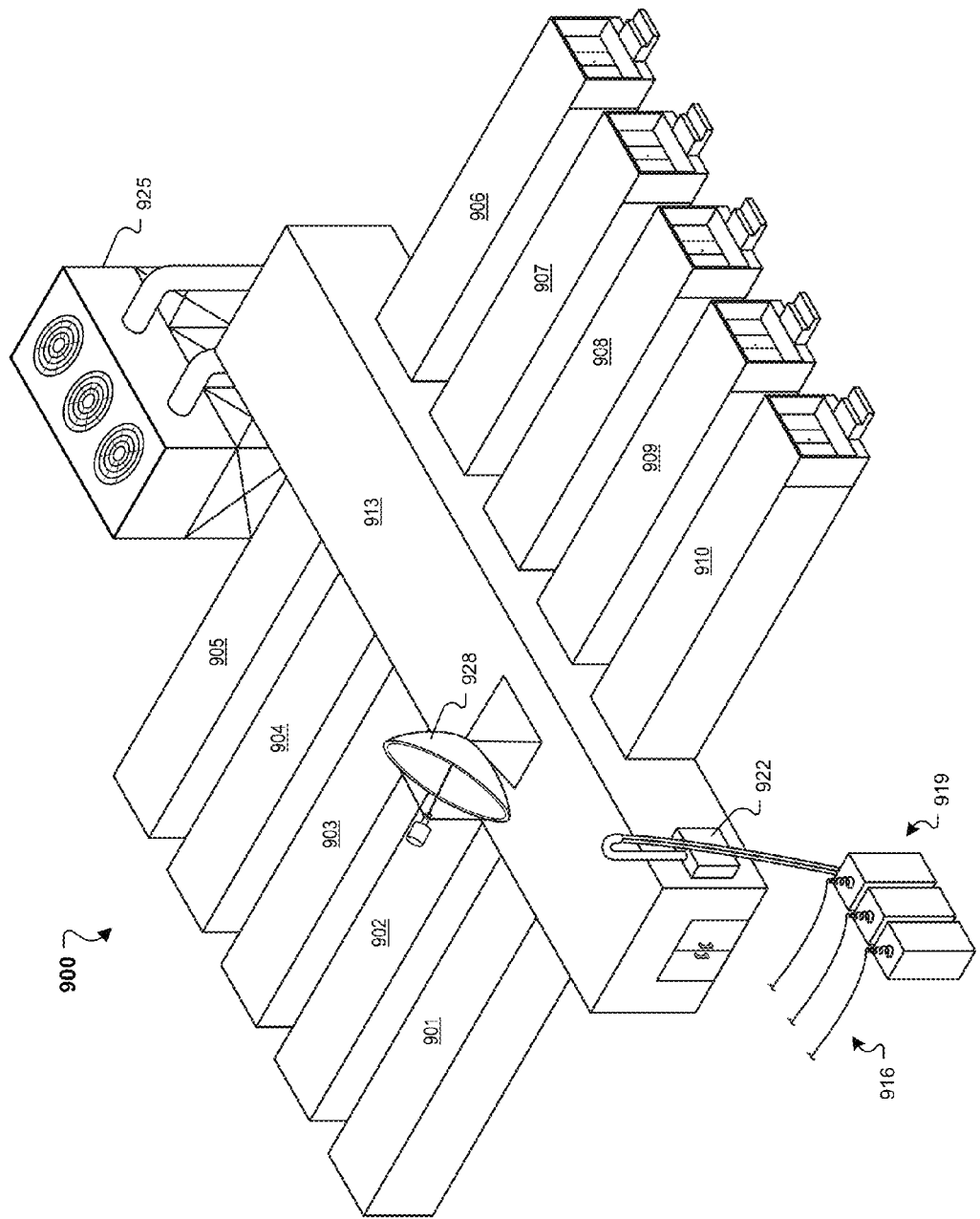
FIG. 9 is perspective diagram of an example modular data center constructed with several modular computing environments.

FIG. 9 is perspective diagram of an example modular data center 900 constructed with several modular computing environments 901-910. As shown, the modular computing environments 901-910 are arranged along a connecting hub, such as, for example, a central "spine" 913 or "backbone" of the modular data center 900. The spine 913 may route electrical power, cooling fluid and networking connections to each modular computing environment 901-910. The spine may also provide access to each modular computing environment 901-910 for human operators.

Electrical power may be provided to the modular data center 900 in the form of medium voltage power (e.g., 13 kV) by a power utility via utility lines 916. The voltage of the incoming power may be reduced by a facility-level transformer 919 (e.g., to 480 VAC) and distributed at a facility level power distribution box 922 and routed to the various modular computing environments within the spine 913. In some implementations, other facility backup or supplemental power may be provided. For example, a diesel backup generator (not shown) may be co-located with the modular data center 900; if the utility power is compromised, the diesel backup generator may provide interim power to the modular data center.

A central cooling plant 925 may be provided at the facility level to provide cooling fluid to each modular computing environment 901-910 for the removal of heat generated within corresponding enclosures of the modular computing environments. As shown (and described above with reference to FIG. 4), the central cooling plant 925 may be a chiller or condenser. In some implementations, the central cooling plant 925 may be a heat exchanger or cooling tower. Cooling fluid may be distributed, within the spine 913, to each modular computing environment 901-910. In some implementations, the central cooling plant may itself be distributed. For example, a portion of the cooling plant (e.g., one cooling tower, one chiller, etc.) may be dedicated to each modular computing environment.

A central communication facility 928 may also be provided at the facility level and may couple the network interfaces of each modular computing environment 901-910 to a larger network. An example communication facility 900 is graphically depicted as a satellite dish, but the communication facility could be any kind of high-bandwidth network connection (e.g., OC-192, 10-gigabit Ethernet, parallel T1 or T3 lines, etc.) and associated networking equipment (e.g., switches, routers, gateways, etc.). In some implementations, the communication facility 928 couples the modular data center 900 to a company's intranet (e.g., the internal network of a financial institution or an Internet information provider); in some implementations, the communication facility 928 couples the modular data center 928 to the Internet.

In some implementations, the spine 913 provides a layer of protection to the utilities (e.g., electrical power, cooling fluid and a network interface) delivered to each modular computing environment 901-910. The utilities may be delivered via flexible "quick-connection" stubs disposed at "docking regions" (not shown) corresponding to locations along the spine 913 that are configured to receive modular computing environments. For example, electrical power may be delivered from a distribution line or bus (not shown) within the spine 913 to heavy-duty "appliance style" connectors that can be plugged into a modular computing environment. Similarly, cooling fluid may be delivered from large supply and return mains (not shown in FIG. 9, but see elements 412 and 415 in FIG. 4 for reference) to flexible hoses with threaded connectors or other connectors (e.g., cam and grove connectors) that can be quickly attached to a modular computing environment. A network interface connection may also be provided by a connector that can be quickly plugged into a modular computing environment.

Deploying the modular data center 900 may be a simple process. In some implementations, the process includes a) providing (e.g., constructing) a facility level cooling plant 925; b) providing a facility-level electrical power system 916, 919 and 922; c) providing a facility-level communication facility 928; d) routing cooling fluid, electrical power and a connection to the facility-level communication interface to various docking regions (not shown), which may be optionally located in a spine 913; e) providing two or more modular computing environments 901-910 at two or more of the docking regions; and f) connecting the utilities to the modular computing environments using the quick-connection stubs disposed at the docking regions.

The example method of deploying the modular data center may have one or more of the following advantages: modular data centers may be quickly deployed; a modular data center 900 may be constructed in parallel (e.g., modular computing environments may be constructed in parallel with facility level resources); the modular data center 900 may be easily expanded to incrementally add computing power; large portions of the modular data center 900 may be mobile to facilitate relocation; and portions of the modular data center 900 may be prefabricated, possibly at lower cost than would be possible if the modular data center 900 were serially constructed from scratch (e.g., some manufacturing labor may be used in place of trade labor). Moreover, portions of a modular data center may be manufactured in a controlled factory environment, rather than at a less controlled construction site, thereby reducing overall costs associated with lower quality control.

Figure 10:
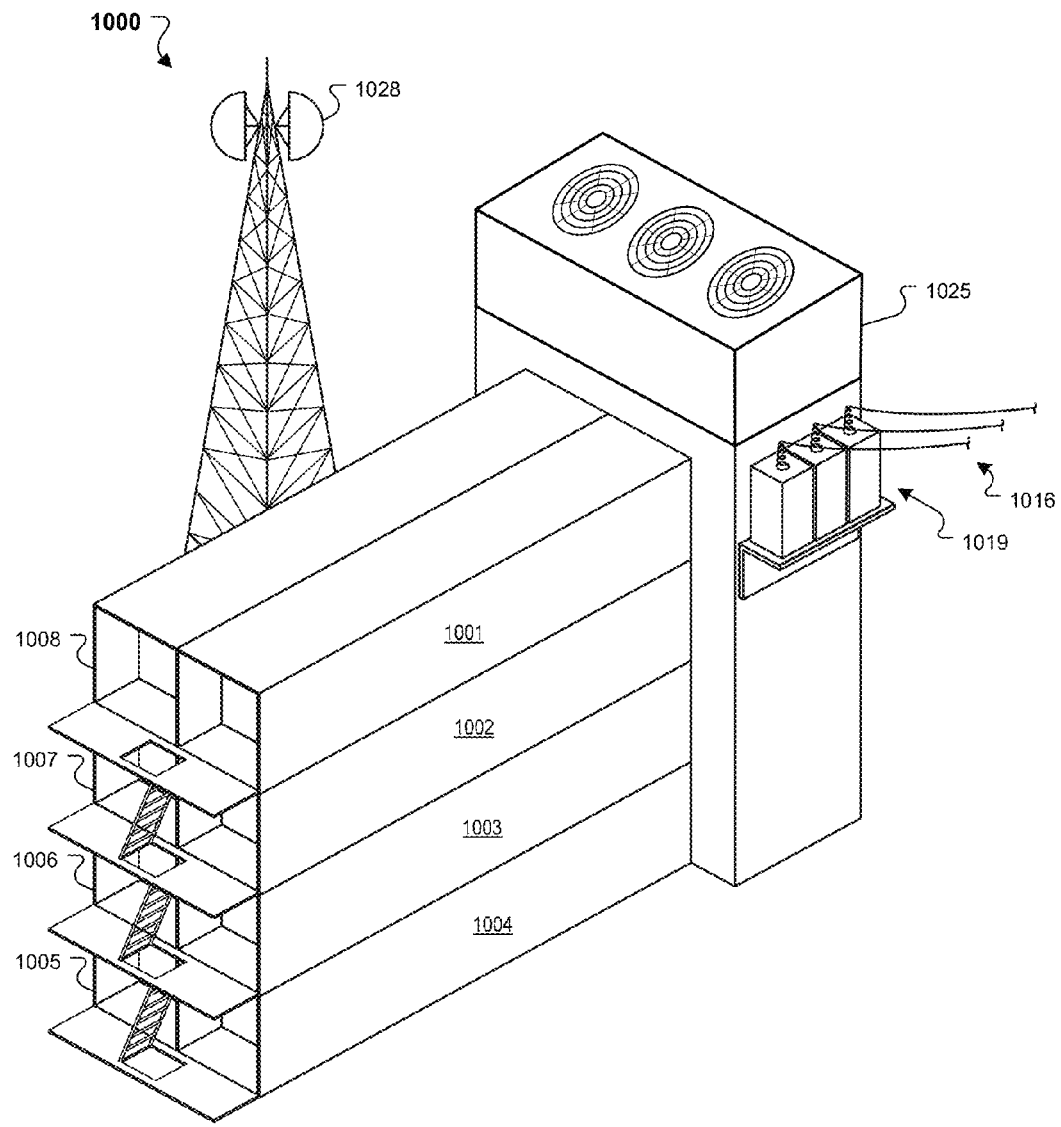
FIG. 10 is a perspective diagram of another example modular data center constructed with several modular computing environments.

Other implementations are contemplated. For example, although ten modular computing environments 901-910 are shown, a data center may have many more (e.g., 10-100 modular computing environments); the modular computing environments 901-910 could have other arrangements, such as a star configuration centered around utility and network distribution points within a ring-shaped connecting hub (not shown), or a stacked configuration coupled to a vertical spine as illustrated in FIG. 10. The connecting hub need not necessarily be either linear or circular or any other regular or symmetric shape. In general, virtually any shape, size or configuration of connecting hub can be used to accommodate objectives of a system designer. As described above, backup or supplemental generators may be provided. Cooling and communication facilities may take forms other than those depicted.

FIG. 10 is a perspective diagram of another example modular data center 1000 constructed with multiple modular computing environments 1001-1008 and having a stacked configuration. Except for configuration, the modular data center 1000 is very similar to the modular data center 900: it includes a facility-level cooling plant 1025, a facility-level electrical power source 1016; a facility-level communication facility 1028; and the modular computing environments 1001-1008. A vertical spine 1013 may route the utilities to the modular computing environments 1001-1008, and the facility-level cooling plant 1025 may be disposed above the spine 1013 or elsewhere. Facility-level power conversion equipment 1019 and power distribution equipment (not shown) may be provided. FIG. 10 is an example of another possible data center configuration; as described above, other configurations are contemplated. As one additional example, a data center may be disposed onboard a ship; electrical power may be provided by an on-ship generator, and the cooling plant may incorporate seawater.

Figure 11:
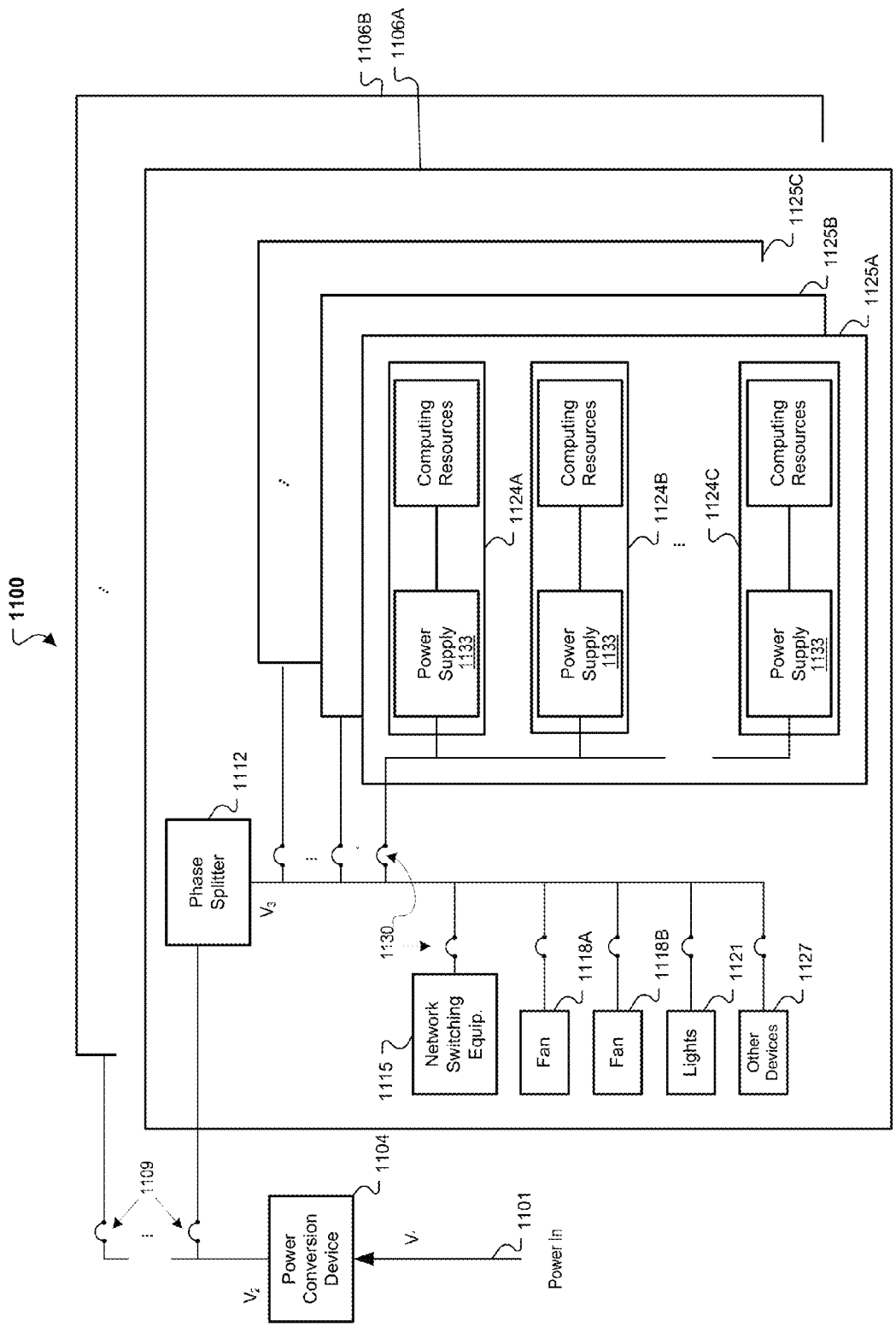
FIG. 11 is a block diagram of an example facility-level electrical distribution system for a data center.

FIG. 11 is a block diagram of an example facility-level electrical distribution system 1100 that may be included in a modular data center. As shown, electrical power is provided by a supply 1101 at a voltage V1. In some implementations, this power is supplied by a utility company at a voltage V1 of about 13 kV. The supply 1101 is converted by a power conversion device 1104 to a voltage V2. In some implementations, the power conversion device 1104 is a transformer, and the voltage V2 is about 480 VAC, with three phases provided. In some implementations, electrical power at voltage V2 may be distributed to various modular computing environments 1106A and 1106B. Current protection of the electrical power at the voltage V2 may be provided by circuit protection devices 1109 (e.g., circuit breakers, fuses, surge suppressors, etc.)

In some implementations, each modular computing environment 1106A or 1106B includes a phase splitter 1112 that splits off each of the three phases to single-phase legs having a voltage V3. The phases may be split in a manner that balances the overall load of each modular computing environment. In some implementations, the voltage V3 is single-phase 277 VAC. The three single-phase legs at voltage V3 may be distributed as various circuits to loads within the modular computing environment 1106A or 1106B. For example, networking switching equipment 1115 may have a dedicated circuit. A fan, or a number of fans 1118A and 1118B may have a dedicated circuit (in some implementations, adjacent fans may be supplied by different circuits for reliability). Lights 1121 may have a dedicated circuit. Groups of processing boards 1124A-1124C may have dedicated circuits (e.g., a column of processor boards in a rack, or another portion of a rack 1125A, 1125B or 1125C may have a dedicated circuit). Other devices 1127 may also have dedicated circuits (e.g., lighting, fire/smoke detection devices and a fire suppression system). In some implementations, circuits are designed to be small enough that disruption of a circuit (or a small fraction of the total number of circuits) will not critically disrupt operation of the modular computing environment. In particular, for example, cooling components can be powered by multiple circuits so that disruption of one circuit will not significantly impact the overall cooling capacity of the modular computing environment. As shown, each circuit at the voltage V3 may have over-current devices 1130 (e.g., circuit breakers, fuses, surge suppressors, etc.). In some implementations, each processor board 1124A-C includes an on-board power supply 1133 that converts electrical power having voltage V3 to one or more voltages suitable for components on the corresponding processor board.

Other implementations are contemplated. For example, at the facility level, additional power sources, such as backup or supplemental generators may be provided. Single-phase power may be used throughout a facility in some implementations. Voltages other than those described above may be employed.

Figure 12:
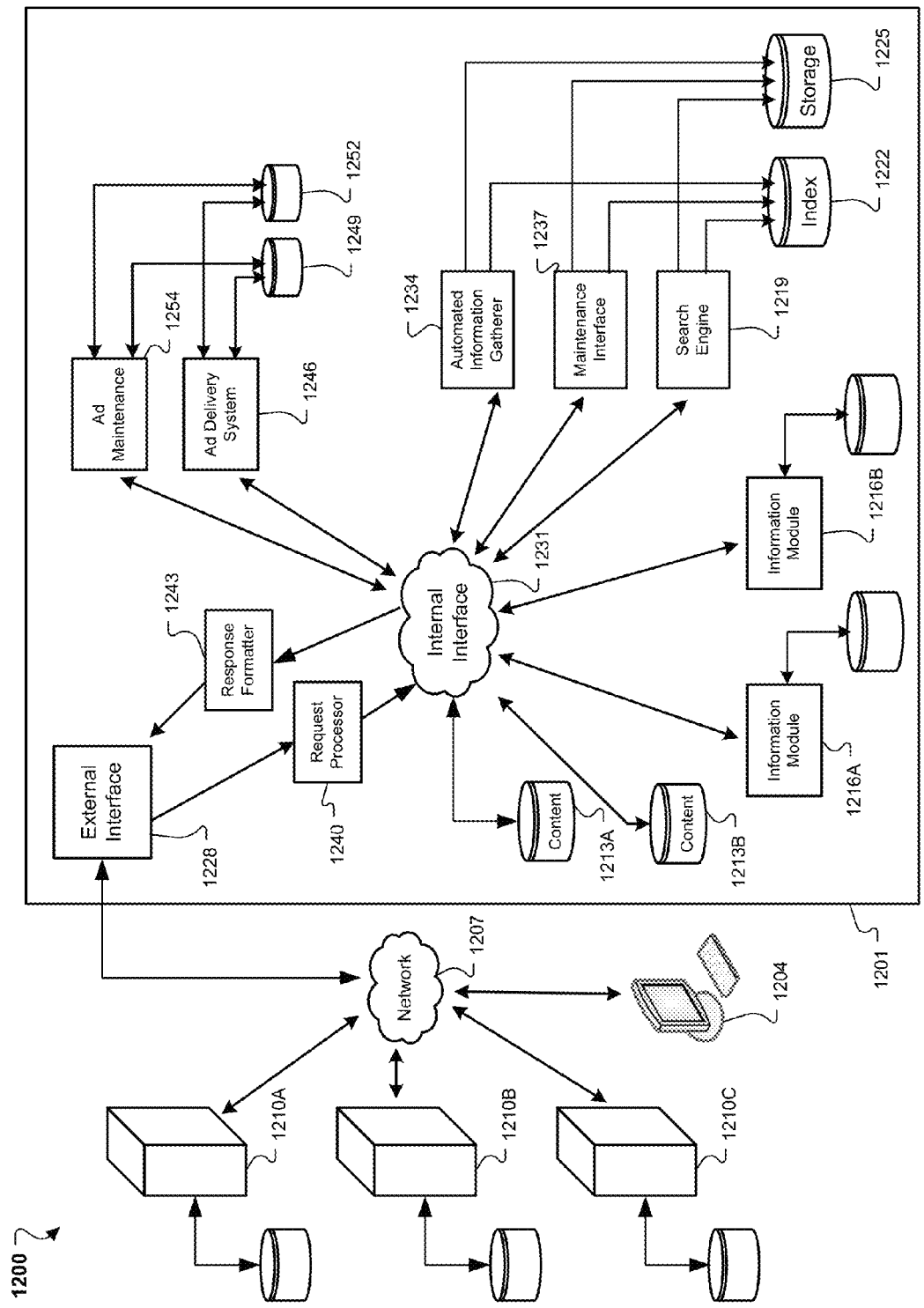
FIG. 12 is a block diagram of an example information provider, according to some implementations.

FIG. 12 is a block diagram of an example information provider 1201 and an environment 1200 in which the information provider may function. As described above, an information provider is one example application of a massively parallel computer system/data center. In operation, the information provider 1201 may provide content and specific information services to client devices (e.g., to the client device 1204) that access the information provider through a network 1207, such as the Internet. Information services may include a search engine function for locating content that is accessible from the network 1207. Information services may also include providing specific kinds of information, such as time-sensitive news about particular topics (e.g., business news, financial news, etc.), weather information for a specific location, driving directions to navigate between two locations, or traffic congestion information. The information provider 1201 may access other content providers 1210A, 1210B and 1210C through the network 1207, and may index content stored on the content providers 1210A, 1210B and 1210C, for example, in order to provide a search engine service.

Various components of the example information provider 1201, as shown, are now described. The information provider 1201 may include content stores 1213A and 1213B, which may store specific kinds of information, such as, for example, maps of various locations, or images related to particular topics. The information provider 1201 also includes information modules 1216A and 1216B, which may each provide specific services such as determining driving directions between two locations, or providing timely weather information for a specific location. The information provider 1201 includes a search engine 1219 that may be configured to locate content that is internal or external to the information provider 1201 (e.g., content in content stores 1213A or 1213B, or content stored by the content providers 1210A-C).

To provide a search engine function, the information provider 1201 may maintain an index 1222 (e.g., an index database) and may further use system storage 1225 to maintain the index or provide the search engine functions. The index database 1222 may contain data that represents information that the information provider 1201 provides to users. For example, the index database 1222 may contain links to information stored on content providers 1210A-C outside of the information provider 1201. Some information referenced by entries in the index database 1222 may be stored in the system storage 1225. For example, the system storage 1225 may "mirror" information for which search reports are regularly received—such as, for example, breaking news stories or weather or traffic information. The system storage 1225 may also store various components needed for general operation of the information provider 1222, such as, applications, system parameters, and information about users who access the system.

The index database 1222 may or may not be cached. For example, the index database 1222 may include a separate cached index database (not shown) to support faster access to search results. The system storage 1225 may be local to the information provider 1225, or it may be distributed, such as, for example, in an external server or storage farm (not shown). Within the information provider 1201, the search engine 1219 may operate to produce search results that include information stored in the index database 1222 or the system storage 1225, in response to search requests from users.

As shown, the information provider 1201 receives and transmits data through an external interface 1228 and an internal interface 1231. Through the external interface 1228, which may include one or more Web servers (not shown), the information provider 1201 receives requests and transmits responses from and to external computing devices (e.g., the client device 1204). Through the internal interface 1231, the information provider 1201 internally routes information to and from the index database 1222 and the system storage 1225 via various paths (some of which are not shown), and to and from the information modules 1216A and 1216B and the content stores 1213A and 1213B.

Each interface 1228 and 1231 may include one or more distinct interfaces. For example, a first interface may receive requests, such as, for example, requests for information or search queries; a second interface may transmit results to requesting devices. These interfaces may comprise interface devices for a high-speed, high-bandwidth network such as SONET, Infiniband, or Ethernet, or any suitable communication hardware operating under an appropriate protocol such that the information provider 1201 can respond to a large number of distinct requests simultaneously. The precise design of the interfaces 1228 and 1231 or of the overall information provider 1201 is not critical to this description and may take any suitable form.

Information in the index database 1222 may be gathered by an automated information gatherer 1234, such as, for example, a Web crawler or a spider. The automated information gatherer may, for example, continuously, or almost continuously, obtain new information from sources connected to the network 1207 or to other networks. The automated information gatherer 1234 may also retrieve content in response to a search query. This content may be provided to the index database 1222 or to the system storage 1225, or to both. The index database 1222 may index data that is accessible from the network 1207 or from another network.

In addition to being added to the index database 1222 or system storage 1225 in an automated fashion, information may also be manually loaded in or retrieved from the index database 1222 or the system storage 1225 through a maintenance interface 1237. For example, a maintenance interface 1237 may allow an administrator of the information provider 1201 to manually add bulk data to the index database 1222 or to the system storage 1225.

Data requests, such as queries received from users, may be received and processed through a request processor 1240. The request processor 1240 may, for example, parse requests, and, if necessary, reformat them (e.g., from HTML (hypertext markup language) or text format, to search term or strings that are compatible with the search engine 1219). The request processor 1240 may operate in conjunction with the external interface 1228. In some embodiments, the request processor 1240 may be included in the external interface 1228.

Responses to data requests may be formatted for delivery by a response formatter 1243. The response formatter 1243 may, for example, format content that is responsive to data requests in a format like HTML, XML (Extensible Markup Language), WML (Wireless Markup Language), or some other suitable format. The response formatter 1243 may operate in conjunction with the external interface 1228. In some embodiments, the response formatter 1243 may be included in the external interface 1228.

The information provider 1201 may further include an ad delivery system 1246, along with an ad database 1249 and an ad log 1252. The ad delivery system 1246 may receive query requests and other input from the internal interface 1231. In some embodiments, the ad delivery system 1246 may select an ad from the ad database 1249 to deliver in conjunction with other content, such as, for example, a response to the query. The selected ad may correspond to content of the search query. For example, in response to a user who submits a query for a restaurant near a particular location having a particular cuisine (e.g., That food), the information provider may deliver, along with information about various restaurants having that cuisine in that location, a coupon for a particular restaurant. The response formatter 1243 may combine search results from the search engine 1219 and ad results from the ad delivery system 1246 into an overall response and may send that response to the device from which the original query was receive, via the network 1207. An ad maintenance module 1254 may be provided to add, manage and remove ads in the ad database 1249

Some ads may solicit a response from the recipient. For example, an ad may include a link that a user can select to receive additional information or to perform other actions. Any such responses may be directed back to the information provider 1201 and subsequently logged. For example, the information provider 1201 may receive, via the interfaces 1228 and 1231 and ad delivery system 1246, a response to a previously delivered ad. The ad delivery system 1246 may store this response in the ad log 1252. The ad log 1252 may be subsequently used to bill sponsors of such ads or to log various statistics related to ads and to their effectiveness.

Figure 13:
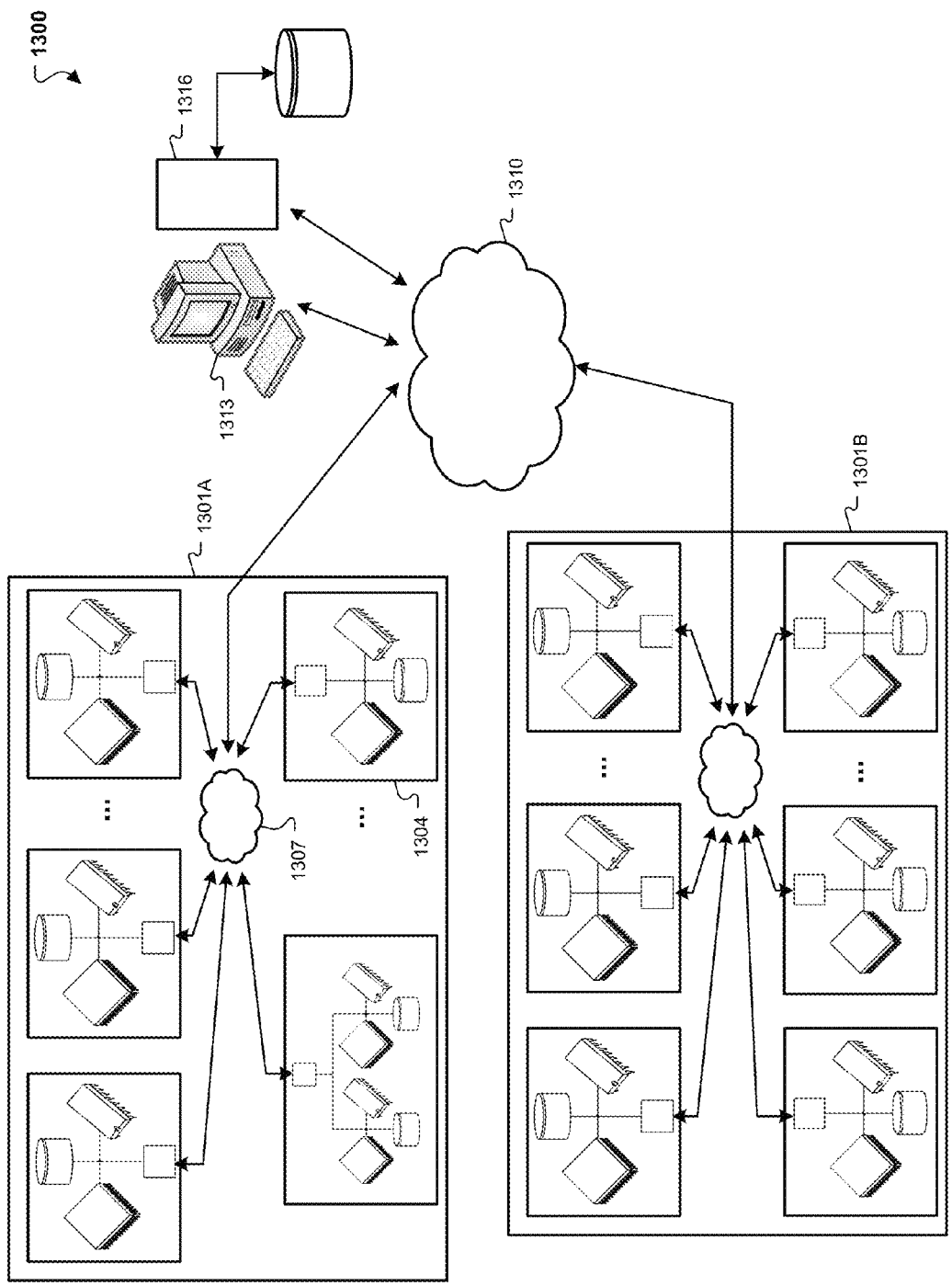
FIG. 13 is a block diagram illustrating how portions of an information provider may be implemented using a modular data center.

FIG. 13 is a block diagram 1300 illustrating one topology of two modular computing environments 1301A and 1301B. As shown, each modular computing environment 1301A and 1301B includes a plurality of processing devices (e.g., processing device 1304, which may include a processor board in a rack system) coupled to an internal network (e.g., network 1307). The internal network 1307 may include a patch panel, switch or router (not shown); and the internal network may connect to another network 1310, that also connect to other modular computing environments. Other devices may connect to the network 1310, such a client device 1313 or a server device 1316. In some implementations, the resources of the modular computing environments 1301A and 1301B may be accessed from either the client device 1313 or the server device 1316. A topology similar to that depicted in FIG. 13 may be used to implement various portions of the information provider 1201 that is described with reference to FIG. 12. For example, in some implementations, the modular computing environments 1301A or 1301B may implement a portion of the index database 1222, the search engine 1219, the content stores 1213A or 1213B, the request processor 1240, the information modules 1216A or 1216B, another component, or some combination of the above-described components.

A number of embodiments have been described. Nevertheless, it will be understood that various modifications may be made without departing from the spirit and scope of the disclosed embodiments. Accordingly, other embodiments are within the scope of the following claims:

What is claimed is:

1. A method of deploying a modular data center comprising:

providing a cooling plant that comprises a cooling fluid source, a cooling fluid source output, and a cooling fluid source input;

coupling a connecting hub to the cooling plant, the connecting hub comprising a plurality of docking regions, each docking region including an electrical power source, a data communication interface, a cooling fluid supply that is fluidly coupled to the cooling fluid source output, and a cooling fluid return that is fluidly coupled to the cooling fluid source input;

providing a first modular computing environment that comprises a specified amount of computing power through a specified plurality of computing devices, a plurality of cooling units that comprise cooling fluid input stubouts and cooling fluid output stubouts, and a human-occupiable aisle that extends between rows of racks that support the specified plurality of computing devices;

connecting the first modular computing environment to a first docking region of the plurality of docking regions by i) fluidly connecting the cooling fluid input stubouts to the cooling fluid supply, ii) fluidly connecting the cooling fluid output stubouts to the cooling fluid return, and iii) connecting the specified plurality of computing devices of the first modular computing environment to the electrical power source and the data communication interface;

subsequent to connecting the first modular computing environment to the first docking region, determining a requirement for an additional amount of computing power greater than the specified amount of computing power;

based on the determination, providing a second modular computing environment that comprises a specified amount of computing power through a specified plurality of computing devices, a plurality of cooling units that comprise cooling fluid input stubouts and cooling fluid output stubouts, and a human-occupiable aisle that extends between rows of racks that support the specified plurality of computing devices; and connecting the second modular computing environment to a second docking region of the plurality of docking regions by i) fluidly connecting the cooling fluid input stubouts of the second modular computing environment to the cooling fluid supply, ii) fluidly connecting the cooling fluid output stubouts of the second modular computing environment to the cooling fluid return, and iii) connecting the specified plurality of computing devices of the second modular computing environment to the electrical power source and the data communication interface.

2. The method of claim 1, further comprising:

subsequent to connecting the second modular computing environment to the second docking region, determining a requirement for an additional amount of computing power greater than the specified amount of computing power of the first and second modular computing environments;

based on the determination, providing a third modular computing environment that comprises a specified amount of computing power through a specified plurality of computing devices and a plurality of cooling units that comprise cooling fluid input stubouts and cooling fluid output stubouts; and connecting the third modular computing environment to a third docking region of the plurality of docking regions by i) fluidly connecting the cooling fluid input stubouts of the third modular computing environment to the cooling fluid supply, ii) fluidly connecting the cooling fluid output stubouts of the third modular computing environment to the cooling fluid return, and iii) connecting the specified plurality of computing devices of the third modular computing environment to the electrical power source and the data communication interface.

3. The method of claim 1, wherein the connecting hub comprises one of a spine or a ring.

4. The method of claim 1, wherein each of the first and second modular computing environment comprises a modular container that defines an enclosure that at least partially encloses the respective plurality of computing devices and the respective plurality of cooling units of the first and second modular computing environments.

5. The method of claim 4, wherein the modular container comprises a 1AAA shipping container.

6. The method of claim 1, wherein each cooling unit comprises a fan-coil unit positioned to circulate heated air from the plurality of computing devices through a cooling coil and circulate cooled air from the cooling coil to the plurality of computing devices.

7. The method of claim 2, further comprising:

stacking the second modular computing environment on top of the first modular computing environment prior to connecting the second modular computing environment to the second docking region.

8. The method of claim 7, further comprising:

stacking the third modular computing environment on top of the second modular computing environment prior to connecting the third modular computing environment to the second docking region.

9. The method of claim 1, wherein the cooling fluid source comprises water cooled through at least one of a chiller, a cooling tower, or a heat exchanger.

10. A modular data center comprising:

a cooling plant that comprises a cooling fluid source, a cooling fluid source output, and a cooling fluid source input;

a connecting hub coupled to the cooling plant, the connecting hub comprising a plurality of docking regions, each docking region including an electrical power source, a data communication interface, a cooling fluid supply that is fluidly coupled to the cooling fluid source output, and a cooling fluid return that is fluidly coupled to the cooling fluid source input;

a first modular computing environment coupled to a first docking region of the plurality of docking regions, the first modular computing environment comprising i) a specified amount of computing power through a specified plurality of computing devices that are coupled, through the first docking region, to the electrical power source and the data communication interface, ii) a plurality of cooling units that comprise cooling fluid input stubouts fluidly coupled, through the first docking region, to the cooling fluid supply and cooling fluid output stubouts fluidly coupled, through the first docking region, to the cooling fluid return, and iii) a human-occupiable aisle that extends between rows of racks that support the specified plurality of computing devices;

a second modular computing environment coupled, subsequent in time to the first modular computing environment, to a second docking region of the plurality of docking regions, the second modular computing environment comprising i) a specified amount of computing power through a specified plurality of computing devices that are coupled, through the second docking region, to the electrical power source and the data communication interface, ii) a plurality of cooling units that comprise cooling fluid input stubouts fluidly coupled, through the second docking region, to the cooling fluid supply and cooling fluid output stubouts fluidly coupled, through the second docking region, to the cooling fluid return, and iii) a human-occupiable aisle that extends between rows of racks that support the specified plurality of computing devices.

11. The modular data center of claim 10, further comprising:

a third modular computing environment coupled, subsequent in time to the first and second modular computing environments, to a third docking region of the plurality of docking regions, the third modular computing environment comprising i) a specified amount of computing power through a specified plurality of computing devices that are coupled, through the third docking region, to the electrical power source and the data communication interface, and ii) a plurality of cooling units that comprise cooling fluid input stubouts fluidly coupled, through the third docking region, to the cooling fluid supply and cooling fluid output stubouts fluidly coupled, through the third docking region, to the cooling fluid return.

12. The modular data center of claim 10, wherein the connecting hub comprises one of a spine or a ring.

13. The modular data center of claim 10, wherein each of the first and second modular computing environment comprises a modular container that defines an enclosure that at least partially encloses the respective plurality of computing devices and the respective plurality of cooling units of the first and second modular computing environments.

14. The modular data center of claim 13, wherein the modular container comprises a 1AAA shipping container or a 1CC shipping container.

15. The modular data center of claim 10, wherein each cooling unit comprises a fan-coil unit positioned to circulate heated air from the plurality of computing devices through a cooling coil and circulate cooled air from the cooling coil to the plurality of computing devices.

16. The modular data center of claim 11, wherein the second modular computing environment is stacked, when coupled to the connecting hub through the second docking region, on top of the first modular computing environment.

17. The modular data center of claim 16, wherein the third modular computing environment is stacked, when coupled to the connecting hub through the third docking region, on top of the second modular computing environment.

18. The modular data center of claim 11, wherein the second modular computing environment is positioned, when coupled to the connecting hub through the second docking region, side-by-side to the first modular computing environment.

19. The modular data center of claim 10, wherein the cooling fluid source comprises water cooled through at least one of a chiller, a cooling tower, or a heat exchanger.

20. The modular data center of claim 10, wherein each modular computing environment is sealed against environmental elements of wind and moisture.

* * * * *